United States Patent
Gunji et al.

(10) Patent No.: US 7,582,544 B2
(45) Date of Patent: Sep. 1, 2009

(54) ALD FILM FORMING METHOD

(75) Inventors: Isao Gunji, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 172 days.

(21) Appl. No.: 11/608,504

(22) Filed: Dec. 8, 2006

(65) Prior Publication Data

US 2007/0134919 A1    Jun. 14, 2007

(30) Foreign Application Priority Data

Dec. 8, 2005    (JP)    ............................. 2005-355152

(51) Int. Cl.
*H01L 21/36*    (2006.01)
(52) U.S. Cl. .............................. 438/478; 257/E21.001
(58) Field of Classification Search .................. 438/478; 257/E21.001
See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 5,916,365 A | 6/1999 | Sherman |
| 6,416,822 B1 | 7/2002 | Chiang et al. |
| 6,878,402 B2 | 4/2005 | Chiang et al. |
| 6,902,763 B1 * | 6/2005 | Elers et al. ................... 427/250 |
| 7,097,886 B2 * | 8/2006 | Moghadam et al. ......... 427/569 |
| 2006/0046518 A1 * | 3/2006 | Hill et al. .................... 438/778 |

OTHER PUBLICATIONS

A. Grill, et al. "Hydrogen Plasma Effects on Ultralow-k Porous SiCOH Dielectrics", Journal of Applied Physics 98, 074502, 2005, 7 pgs.

Riikka L. Puurunen. "Surface Chemistry of Atomic Layer Deposition: A Case Study for the Trimethylaluminum/Water Process", Applied Physics Reviews, Journal of Applied Physics 97, 121301, 2005, 52 pgs.

* cited by examiner

*Primary Examiner*—W. David Coleman
(74) *Attorney, Agent, or Firm*—Oblon, Spivak, McClelland, Maier & Neustadt, P.C.

(57) ABSTRACT

A film forming method, for depositing a thin film on a surface of a substrate mounted on a mounting table disposed in a vacuum processing chamber, includes an adsorption process for adsorbing a film forming material on the substrate by introducing a source gas into the processing chamber; and a reaction process for carrying out a film forming reaction, after the adsorption process, by introducing an energy transfer gas into the processing chamber and supplying thermal energy to the film forming material adsorbed on the substrate. By repeating the above process, the thin film is formed on the substrate in a layer-by-layer manner.

19 Claims, 26 Drawing Sheets

ALD FILM FORMING METHOD

FIELD OF THE INVENTION

The present invention relates to a film forming method and apparatus; and, more particularly, to a film forming method for forming a desired thin film on a surface of a substrate by using an ALD (atomic layer deposition) method and a film forming apparatus therefor.

BACKGROUND OF THE INVENTION

As for a representative film forming method for forming a solid thin film on a surface of a substrate such as a semiconductor wafer or the like, there is known a CVD (chemical vapor deposition) method. When a film is formed by using the CVD method, a source needs to be activated by applying energy to a source gas. Accordingly, there has been employed a CVD method for supplying thermal energy to a source gas through a substrate heated by a heater provided at a mounting table for mounting thereon the substrate or a plasma CVD method for supplying energy of a plasma generated in a space above a substrate by introducing a source gas into the atmosphere thereof.

A film forming apparatus for manufacturing an advanced very large scale integrated circuit needs to have a performance (a step coverage performance) of forming a high-quality thin film of a uniform thickness along surfaces of holes/grooves previously formed on a surface of a semiconductor wafer with a diameter/width of tens of nanometers.

In order to obtain a high step coverage performance, a surface reaction needs to take place by activating a source gas on an uppermost surface of a substrate, not by activating it in a gas phase space above the substrate. However, in the CVD method for forming a film by continuously supplying a source gas, a reactant gas and energy, certain source gases may cause a gas phase reaction by an excessive activation thereof in a gas phase. Since the gas phase reaction greatly deteriorates the step coverage performance, there arises a need to suppress the gas phase reaction and facilitate the surface reaction in order to maintain the high step coverage performance.

As for another method for forming a thin film on a surface of a substrate, there is known an atomic layer deposition (ALD) method. With the ALD method, a thin film having high step coverage can be formed on a substrate disposed inside a vacuum chamber by repetitively performing a film forming process and a purge process. In the ALD film forming process, a reaction is carried out by supplying energy to a monomolecular or a multimolecular adsorption layer adsorbed on a surface, the adsorption layer being formed of molecules of a source compound. In the purge process, the atmosphere inside the vacuum chamber is substituted.

The ALD method for forming a film while suppressing a gas phase reaction was suggested in 1977 by Suntola et al. (see U.S. Pat. No. 4,058,430). The method is performed by alternately supplying a source gas and a reactant gas to a substrate at different timings, as shown in FIG. 24, and then removing a residual source gas and a by-product gas of a previous cycle remaining in a gas phase with a non-reactive purge gas before supplying the source gas and the reactant gas again. The gas phase reaction can be suppressed by repeating those cycles. Further, the high step coverage performance can be maintained by restricting the reaction to take place at the uppermost surface of the substrate. There are plenty of reports on the ALD method (see, e.g., R. L. Puurunen, "Surface chemistry of atomic layer deposition: A case study for the triethylaluminum/waterprocess", Journal of Applied Physics, APPLIED PHYSICS REVIEW, vol. 97, p 121301 (2005)).

In an initial ALD method, although the source gas and the reactant gas are separately provided as shown in FIG. 24, the energy (heat) is constantly supplied. This is because the initial ALD method supplies the thermal energy to a surface of a substrate via the substrate by heating the entire substrate as in the thermal CVD method and, therefore, a time responsiveness in controlling an on/off of energy supply becomes poor (see, e.g., U.S. Pat. No. 4,389,973). Such an ALD method is referred to as "thermal ALD method". In this method, since the energy is constantly supplied during a source gas supply process, parts of the source gas may ever cause an self-pyrolysis reaction in a gas phase by receiving the thermal energy transferred in the gas phase from the substrate, which leads to a deterioration of the step coverage performance.

Moreover, since the entire substrate is heated constantly during the processing, a solid layer that has been formed by a previous process may be deteriorated by the heat.

To solve those drawbacks, Sherman et al. has suggested an ALD method for supplying energy by radicals generated by an RF power supply (see U.S. Pat. No. 5,916,365). Further, Chiang et al. has suggested a method for supplying energy by radicals and ions generated from a plasma (see U.S. Pat. No. 6,416,822). In these methods, the energy is supplied not by heat but by chemically active species (radicals, ions or combination thereof) generated from the RF power supply, so that an ON/OFF of energy supply can be controlled with fine time-responsiveness. Such an ALD method is referred to as "a plasma-assisted ALD method".

In the plasma-assisted ALD method, a source gas supplying process and an energy supplying process can be carried out at different timings. Therefore, it is possible to prevent a self-pyrolysis reaction of the source gas from taking place during the source gas supplying process, the self-pyrolysis reaction being caused by the continuous supply of thermal energy. Further, since such a method is not a method for supplying energy through a substrate being continuously heated, it is possible to avoid the problem of deteriorating the previously formed solid layer with the heat.

However, the method using as an energy source radicals or ions generated from a plasma has new problems to be described as follows.

Firstly, the excessively high energy of the active species (radicals, ions and electrons) generated from a plasma inflicts a serious physical damage or causes a chemical deterioration on a base layer of a substrate where a film will be formed (see, e.g., A. Grill et al, "Hydrogen plasma effects on ultra low-k porous SiCOH dielectric", Journal of Applied Physics, vol. 98, p 074502 (2005)).

Secondly, the active species also collide against not only the substrate but also an inner surface of an apparatus in contact with the plasma, thereby causing a physical sputtering, which in turn result in impurity incorporation into the surface of the substrate.

Thirdly, since the energy is also supplied by the active species to side chain groups contained in the source gas that are desirably to be removed by the reaction, the side chain groups may be incorporated as undesired impurities into the film.

Fourthly, a potential gradient generated inside the apparatus electrically may destroy fine integrated circuits formed on the substrate.

Fifthly, high energy ultraviolet rays generated from the plasma may deteriorate the base layer of the substrate.

As long as the energy is supplied by using the plasma, the aforementioned problems may be only partially, but not completely, avoided.

In order to avoid those problems generated in supplying energy by the plasma, Chiang et al. has suggested a method for supplying energy by light (see, U.S. Pat. No. 6,878,402). In case the energy is supplied by irradiating light on a surface of a substrate, a window for transmitting the light needs to be provided above the substrate. Since, however, a surface of the window becomes dirty during a film forming process, the light is reflected or absorbed and, thus, an intensity of the light reaching the substrate decreases. Moreover, in case the surface of a processing target substrate is made of a metal, the light is reflected on the surface of the substrate, which hinders the energy supply for the reaction.

SUMMARY OF THE INVENTION

It is, therefore, an object of the present invention to provide a film forming method capable of forming a high-quality thin film having high step coverage on a surface of a substrate without deteriorating a thin film previously formed on the substrate with heat or inflicting plasma damages thereon.

The present inventors have achieved the present invention by conceiving an energy supply method based on the ALD method and finding solutions to the aforementioned problems.

In accordance with a first aspect of the present invention, there is provided a film forming method for depositing thin films on a surface of a substrate mounted on a mounting table arranged in a vacuum evacuable processing chamber, the method comprising the steps of: an adsorption process for adsorbing a film forming material on the substrate by introducing a source gas into the processing chamber; and a reaction process for carrying out a film forming reaction, after the adsorption process, by introducing an energy transfer gas into the processing chamber and supplying thermal energy to the film forming material adsorbed on the substrate.

In view of the first aspect, it is preferable to further include a purge process for introducing a purge gas into the processing chamber. Preferably, the adsorption process and the reaction process are alternately performed, and the purge process is performed therebetween. Moreover, it is preferable to further include a pressure increasing process for increasing a pressure inside the processing chamber before the reaction process. In such a case, it is preferable that a pressure decreasing process for decreasing an inner pressure of the processing chamber is provided upon or after the reaction process is completed. In the reaction process, it is preferable to introduce a reactant gas chemically participating in the film forming reaction in addition to the energy transfer gas. Further, it is preferable that the reactant gas is one of a reduction gas, a carbonization gas, a nitrification gas and an oxidizing gas.

Further, it is preferable that the energy transfer gas is selected among a reduction gas, a carbonization gas, a nitrification gas and an oxidizing gas.

Preferably, the source gas is introduced and exhausted such that a gas flow is formed in a direction parallel to the surface of the substrate mounted on the mounting table. Furthermore, preferably, the source gas is introduced and exhausted such that a gas flow is formed in a direction of colliding against the surface of the substrate mounted on the mounting table. Preferably, the energy transfer gas is injected toward the surface of the substrate mounted on the mounting table, the surface having the film forming material adsorbed thereon.

Preferably, the adsorption process is performed while controlling a temperature of the substrate mounted on the mounting table to a level at which the film forming material is adsorbable.

Preferably, the film forming material contains at least one metal element selected from a group consisting of Al, Si, Ti, Cr, Mn, Fe, Co, Ni, Cu, Zn, Ge, Zr, Mo, Ru, Rh, Pd, Ag, Ba, Hf, Ta, W, Re, Ir and Pt. Further, it is preferable that the thin films are deposited on the substrate by repeating a plurality of cycles of performing a film forming reaction with a film forming material of a monomolecular or a multimolecular adsorption layer through an atomic layer deposition method.

In accordance with a second aspect of the present invention, there is provided a computer-executable program for controlling the processing chamber such that the film forming method of the first aspect of the present invention is performed.

In accordance with a third aspect of the present invention, there is provided a computer readable storage medium for storing therein a computer-executable program, wherein the control program controls the processing chamber such that the film forming method of the first aspect of the present invention is performed.

In accordance with a fourth aspect of the present invention, there is provided a film forming apparatus including: a processing chamber accommodating therein a substrate, for performing a film forming process; a mounting table for mounting thereon the substrate in the processing chamber; a source gas inlet for introducing a source gas into the processing chamber; an energy transfer gas inlet for injecting an energy transfer gas toward a surface of the substrate mounted on the mounting table in the processing chamber; a gas exhaust unit for vacuum exhausting an inside of the processing chamber; and a controller for controlling the film forming method described in any one of claims 1 to 14 to be performed.

In accordance with a fifth aspect of the present invention, there is provided a film forming apparatus including: a processing chamber accommodating therein a substrate, for performing a film forming process; a mounting table for mounting thereon the substrate in the processing chamber; a source gas inlet for introducing a source gas into the processing chamber; an energy transfer gas inlet for injecting an energy transfer gas toward a surface of the substrate mounted on the mounting table in the processing chamber; and a gas discharge port connected with a gas exhaust unit for vacuum exhausting an inside of the processing chamber, wherein the source gas inlet and the gas discharge port are provided such that the introduced source gas flows in a direction parallel to a surface of the substrate mounted on the mounting table before being exhauste.

In accordance with a sixth aspect of the present invention, there is provided a film forming apparatus including: a processing chamber accommodating therein a substrate, for performing a film forming process; a mounting table for mounting thereon the substrate in the processing chamber; a source gas inlet for introducing a source gas into the processing chamber; an energy transfer gas inlet for injecting an energy transfer gas toward a surface of the substrate mounted on the mounting table in the processing chamber; and a gas discharge port connected with a gas exhaust unit for vacuum exhausting an inside of the processing chamber by a depressurization, wherein the source gas inlet and the gas discharge port are provided such that the source gas is introduced and exhausted in a direction of colliding against the surface of the substrate mounted on the mounting table.

In accordance with the film forming apparatus of the fifth and the sixth aspect of the present invention, it is preferable that the mounting table includes a temperature control unit for controlling a temperature of the substrate mounted thereon to a level at which a source material is adsorbable on the substrate.

In accordance with the film forming method of the present invention, the adsorption process for adsorbing a film forming material on a substrate by introducing a source gas into a processing chamber is performed at a different timing from the reaction process for carrying out a film forming reaction by introducing an energy transfer gas into the processing chamber and supplying thermal energy to the film forming material adsorbed on the substrate. Accordingly, the whole substrate does not need to be heated for a long period of time. Further, since the thermal energy is supplied by using the energy transfer gas, a surface of the substrate is mainly heated. Therefore, it is possible to avoid drawbacks of a conventional thermal ALD method, such as a deterioration of a solid layer due to a heat, a deterioration of step coverage due to a self-pyrolysis of a gaseous source gas and the like. Moreover, it is also possible to avoid drawbacks of a plasma-assisted ALD method, such as a damage inflicted on a substrate due to a plasma, a deterioration of a film quality due to a sputtering or an excessive activation of a source gas, and the like. Furthermore, the present invention provides a high energy efficiency of the entire process.

Moreover, in accordance with the film forming apparatus of the present invention, a stage heater for maintaining a high temperature of a substrate, a plasma generating device and the like are not required and, also, a high-quality thin film can be formed with a simple configuration.

While the invention has been shown and described with respect to the embodiments, it will be understood by those skilled in the art that various changes and modification may be made without departing from the scope of the invention as defined in the following claims.

BRIEF DESCRIPTION OF THE DRAWINGS

The above and other objects and features of the present invention will become apparent from the following description of embodiments, given in conjunction with the accompanying drawings, in which:

FIG. 2B depicts an example of a grid pattern arrangement;

DETAILED DESCRIPTION OF THE EMBODIMENT

Hereinafter, embodiments of the present invention will be described in detail with reference to the accompanying drawings.

Figure 1:
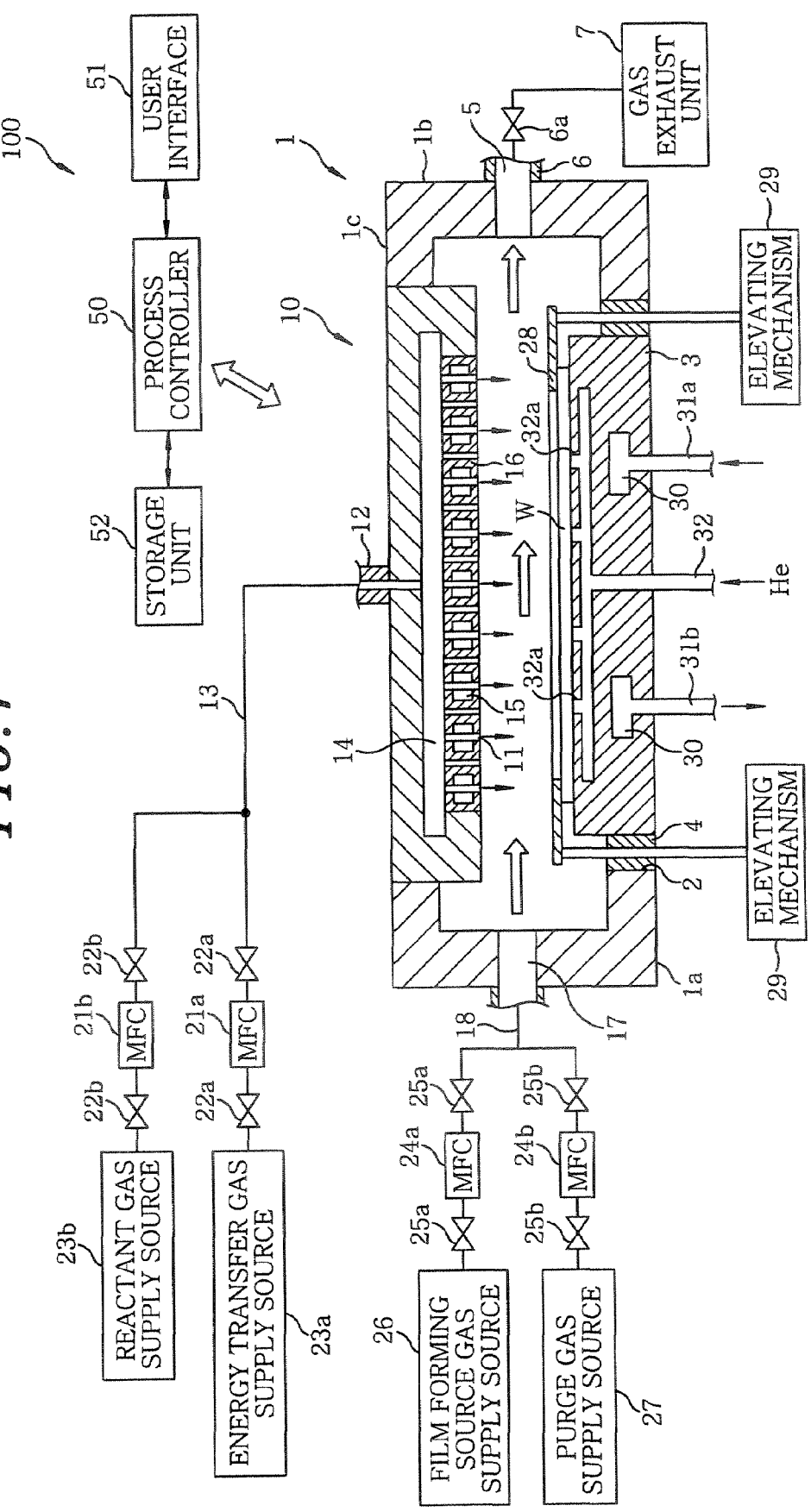
FIG. 1 is a cross sectional view showing a schematic configuration of a film forming apparatus in accordance with a first embodiment of the present invention.

FIG. 1 is a cross sectional view schematically showing an exemplary film forming apparatus suitable for performing a film forming method of the present invention. Such a film forming apparatus 100 has a substantially cylindrical airtight chamber 1. A circular opening 2 is formed at a central portion of a bottom wall 1a of the chamber 1. Further, arranged inside the chamber 1 is a mounting table 3 made of ceramic such as AlN or the like, for horizontally supporting a wafer W (a semiconductor substrate). An insulating unit 4 is provided between the mounting table 3 and the bottom wall 1a and airtightly contacted with the bottom wall 1a of the chamber 1.

A gas exhaust port 5 is formed on a sidewall 1b of the chamber 1 and connected with a gas exhaust unit 7 via a gas exhaust line 6 connected therewith, the gas exhaust unit 7 having a high speed vacuum pump. Moreover, a conductance variable valve 6a is provided in the gas exhaust line 6 to control a gas exhaust amount from the chamber 1. As for the conductance variable valve 6a, there can be used, e.g., a butterfly valve or the like. By operating the gas exhaust unit 7, a gas inside the chamber 1 is exhausted and, further, an inside of the chamber 1 can be depressurized to a predetermined vacuum level at a high speed via the gas exhaust line 6.

A shower head 10 is provided on a ceiling wall 1c of the chamber 1. Disposed on an upper wall of the shower head 10 is a gas inlet port 12 for introducing a gas into the shower head 10. Connected to the gas inlet port 12 is a line 13 for supplying an energy transfer gas such as He, Ar, Kr, Xe, $H_2$, $N_2$, $CO_2$, $CH_4$ or the like. The other end portion of the line 13 connected with the gas inlet port 12 is branched into two. One is connected with an energy transfer gas supply source 23a via a mass flow controller 21a and valves 22a provided in its forward and backward direction, and the other is connected with a reactant gas supply source 23b via a mass flow controller 21b and valves 22b provided in its forward and backward direction.

Figure 2A:
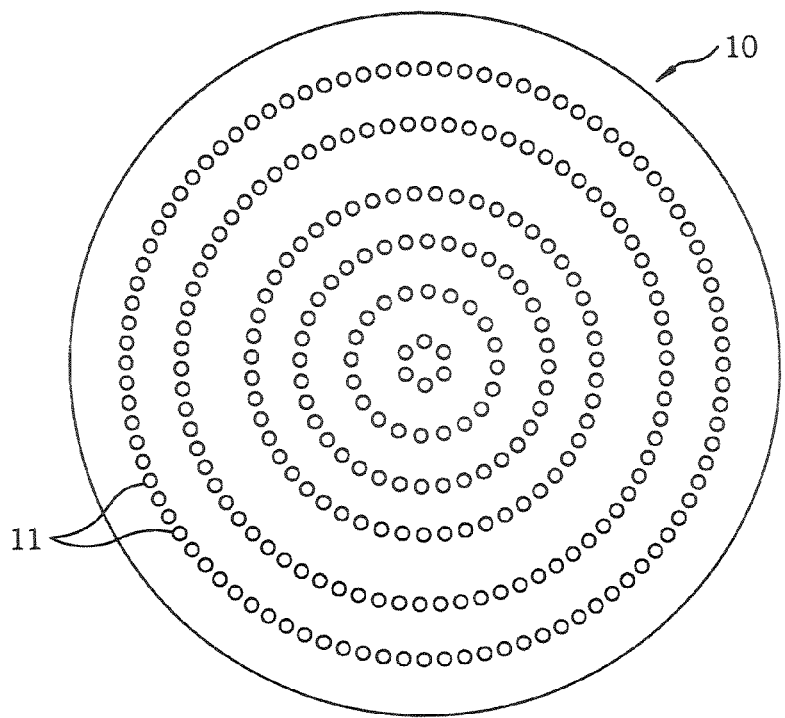
FIGS. 2A and 2B describe arrangements of gas injection openings formed on a bottom surface of a shower head, wherein FIG. 2A provides an example of a concentric arrangement.
Figure 2B:
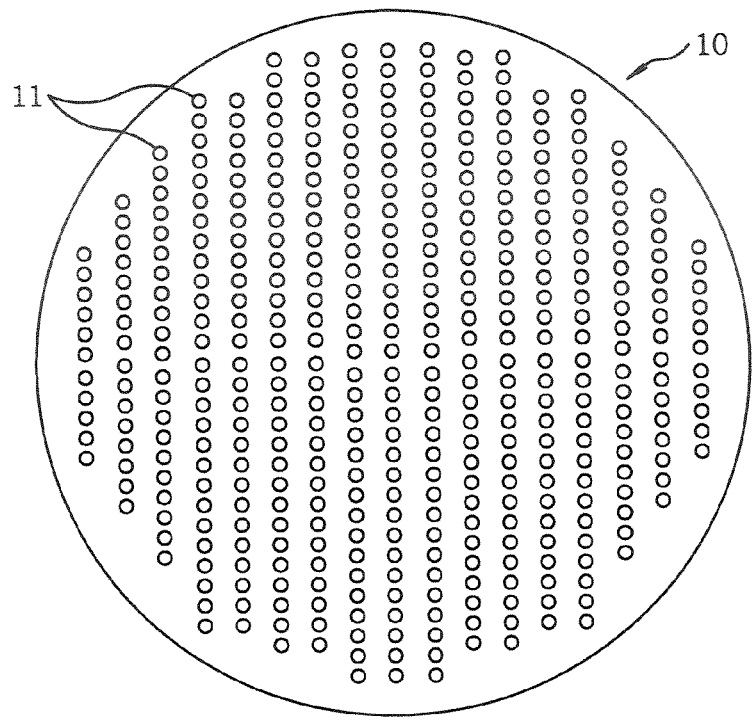

A diffusion space 14 is formed inside the shower head 10. The gas introduced from the gas inlet port 12 is diffused in the diffusion space 14. Formed at a lower portion of the shower head 10 are a plurality of gas injection openings 11 for discharging the energy transfer gas and the reactant gas toward the mounting table 3. The gas injection openings 11 may be arranged in any pattern. For example, they can be formed in a concentric pattern as shown in FIG. 2A or in a grid pattern as illustrated in FIG. 2B. Further, a diameter or the number of the gas injection openings 11 can be appropriately determined depending on film types.

Figure 3:
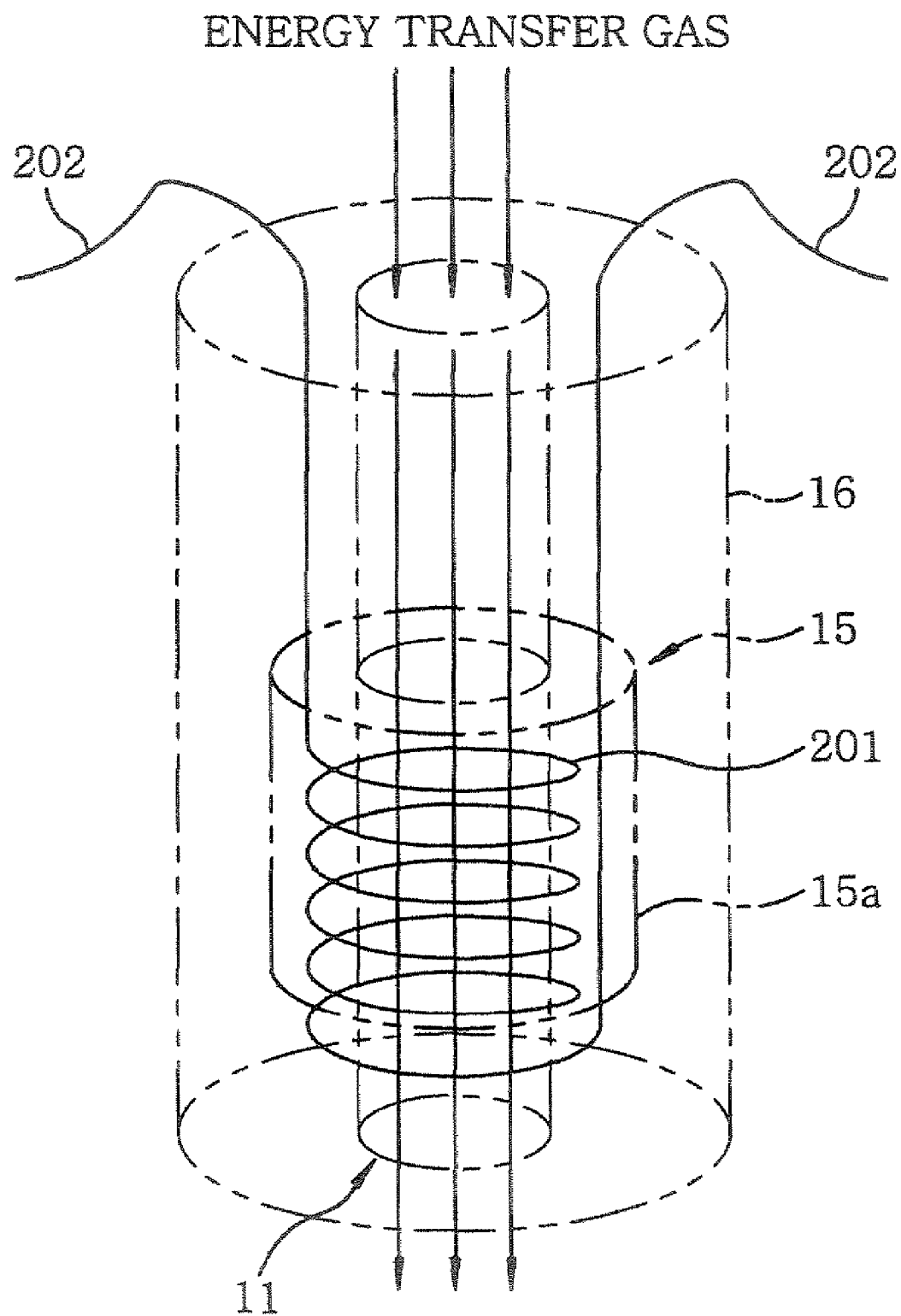
FIG. 3 illustrates a schematic configuration of a heater provided around the injection openings.

Provided near each of the gas injection openings 11 of the shower head 10 is a heater 15 serving as heating units for heating the energy transfer gas inside the shower head 10. Moreover, insulating units 16 are provided around the heaters 15 to insulate the heaters 15, the insulating units 16 being made of a material having a low thermal conductivity, such as heat resistant synthetic resin, quartz, ceramic or the like. FIG. 3 shows an exemplary configuration of a heater 15. The heater 15 includes a cylindrical ceramic member 15a formed to surround the gas injection openings 11 and a resistance (heating wire) 201 embedded in a coil shape in the ceramic member 15a. By supplying power from a heater power supply (not shown) to the resistance 201 via a lead line 202, the energy transfer gas flowing through inside the resistance (heating wire) 201 can be instantly and effectively heated.

A gas inlet port 17 is provided at the opposite side of the gas exhaust ports 5 provided on the sidewall 1b of the chamber 1 and connected with a gas exhaust line 18 for supplying a source gas and a purge gas to the chamber 1. The other end portion of the line 18 is branched into two. One is connected with connected with a source gas supply source 26 via a mass flow controller 24a and valves 25a provided in its forward and backward direction, and the other is connected with a purge gas supply source 27 via a mass flow controller 24b and valves 25b provided in its forward and backward direction.

A film forming source gas supply source 26 is configured to supply a source gas. The source gas contains a metal element in a part of a molecular structure and supplies the metal element as a main constituent of a thin film produced by a reaction. As for the metal element, there can be employed a third periodic element in the periodic table, such as Al, Si or the like, fourth periodic element such as Ti, Cr, Mn, Fe, Co, Ni, Cu, Zn, Ge or the like, fifth periodic element such as Zr, Mo, Ru, Rh, Pd, Ag or the like or sixth periodic element such as Ba, Hf, Ta, W, Re, Ir, Pt and the like.

As for a metal compound forming a source gas, there can be used one of the following exemplary metal compounds:

Al: $Al(CH_3)_3$

Ti: $Ti[N(CH_3)_2]_4$; tetrakis(dimethylamino)titanium (TDMAT)

Cr: $Cr(CO)_6$

Mn: $Mn_2(CO)_{10}$

Fe: $Fe(CO)_5$, $Fe_2(CO)_9$, $Fe_3(CO)_{12}$

Co: $Co_2(CO)_8$

Ni: $Ni(CO)_4$, $Ni(acac)_2$; acac representing Acetylacetone (2,4-pentadion)

Cu: (Hfac)CuTMVS; Hfac representing hexafluoroacetylacetone, and TMVS respresenting trimethylvinylsilane Zn: $Zn(CH_3)_2$ Ge: $Ge(OCH_3)_4$ Zr: $Zr(O-t-C_4H_9)_4$ Mo: $Mo(CO)_6$ Ru: $Ru_3(CO)_{12}$, $Ru(EtCp)_2$; EtCp representing ethyl cyclopantadiene Rh: $Rh_4(CO)_{12}$ Pd: $Pd(OAc)_2$; OAc representing acetate Ag: $Ag[O_2C—C(CH_3)_3]$; 2,2-dimethylpropionate silver (I)

Ba: $Ba(O_2C_{11}H_{19})_2$; Bis(dipivaloymethanato)barium

Hf: $Hf(C_{11}H_{19}O_2)_4$

Ta: $Ta(N-t-C_5H_{11})[N(CH_3)_2]_3$; Tertiaryamylimidotris(dimethylamido) tantalum

W: $W(CO)_6$

Re: $Re_2(CO)_{10}$

Ir: $Ir(C_5H_4C_2H_5)(C_8H_{12})$; ethylcyclopentadienyl(1,5-cyclooctadiene)iridium Pt: $Pt(C_5H_4C_2H_5)(CH_3)_3$; ethylcyclopentadienyl(trimethyl)platinum If necessary, the film forming source gas supply source 26 may be provided with a plurality of source gas supply sources (not shown). Further, in order to introduce the source gas into the chamber, there may be provided, e.g., a heating equipment for sublimating a solid film forming material, a vaporizer for vaporizing a liquid film forming material and the like in addition to a carrier gas supply source for supplying a carrier gas such as Ar or the like (all not shown).

The purge gas supply source 27 is configured to supply a purge gas. The purge gas is used to purge a source gas remaining in a gas phase, by-products generated in the gas phase by a reaction and an energy transfer gas containing a large amount of thermal energy. As for the purge gas, there can be employed $H_2$ gas or a non-reactive gas such as Ar gas, He gas, $N_2$ gas or the like. By introducing the purge gas, the residual source gas in the line 18 can be exhausted. Further, the by-products can be removed by substituting the atmosphere inside the chamber 1. Furthermore, the wafer W can be cooled.

A clamp ring 28 for fixing the wafer W is provided at an outer peripheral portion of the mounting table 3. The clamp ring 28 moves up and down by an elevating mechanism 29 and fixedly presses downward the wafer W mounted on the mounting table 3. Although a thickness of the clamp ring 28 is exaggerated in FIG. 1, the actual thickness is set such that a contact between the source gas and a surface of the wafer W is not interfered. Further, the mounting table 3 is provided with three wafer supporting pins (not shown) capable of protruding and retracting relative to a surface of the mounting table 3 so that the wafer W can be supportively lifted up and down.

A temperature control medium chamber 30 is formed inside the mounting table 3 and configured to control a temperature of the mounting table 3 by introducing thereinto a temperature control medium of a predetermined temperature, e.g., water or Galden (trademark) as a fluorine-based non-reactive liquid, through an introduction path 31a and then discharging it through a discharge path 31b.

A gas channel 32 is formed inside the mounting table 3 from a lower portion of the mounting table 3 to a top surface of the mounting table 3, i.e., a mounting surface of the wafer W. Also, the gas channel 32 is branched into a plurality of gas injection openings 32a near the mounting surface to thereby supply a heat transfer gas, e.g., He gas or the like, to a backside of the wafer W in multiple places at a predetermined pressure. In this way, the temperature of the mounting table 3 is transferred to the wafer W and, accordingly, the temperature thereof is controlled.

The temperature control medium chamber 30 for circulating the temperature control medium and the gas channel 32 for supplying the heat transfer gas to the backside of the wafer W cooperatively serve as a temperature control unit for controlling a temperature of the wafer W.

Provided on the sidewall 1b of the chamber 1 are a loading/unloading port (not shown) for loading/unloading the wafer W to/from a transfer chamber (not shown) disposed adjacent to the film forming apparatus 100 and a gate valve (not shown) for opening/closing the loading/unloading port.

Each component of the film forming apparatus 100 is connected with a process controller 50 having a CPU and controlled by the process controller 50. The process controller 50 is connected with a user interface 51 having a keyboard, a display and the like. A process operator uses the keyboard when inputting commands for managing the plasma processing apparatus 100, and the display is used to display the operation status of the film forming apparatus 100.

Also, the process controller 50 is connected with a storage unit 52 for storing therein recipes including control programs (software) for implementing various processes in the film forming apparatus 100 under the control of the process controller 50, processing condition data and the like.

If necessary, the process controller 50 executes a recipe read from the storage unit 52 in response to instructions from the user interface 51, thereby implementing a desired process in the film forming apparatus 100 under the control of the process controller 50. For example, the process controller 50 controls each mass flow controller, each valve and the gas exhaust unit 7. Accordingly, the source gas, the carrier gas, the purge gas and the like are controlled to be supplied at required flow rates thereof, or the supply thereof is stopped. Furthermore, the recipes such as the control programs, the processing condition data and the like can be read from a computer-readable storage medium, e.g., a CD-ROM, a hard disk, a flexible disk, a flash memory or the like, or transmitted on-line from another device via, e.g., a dedicated line when necessary.

Figure 4:
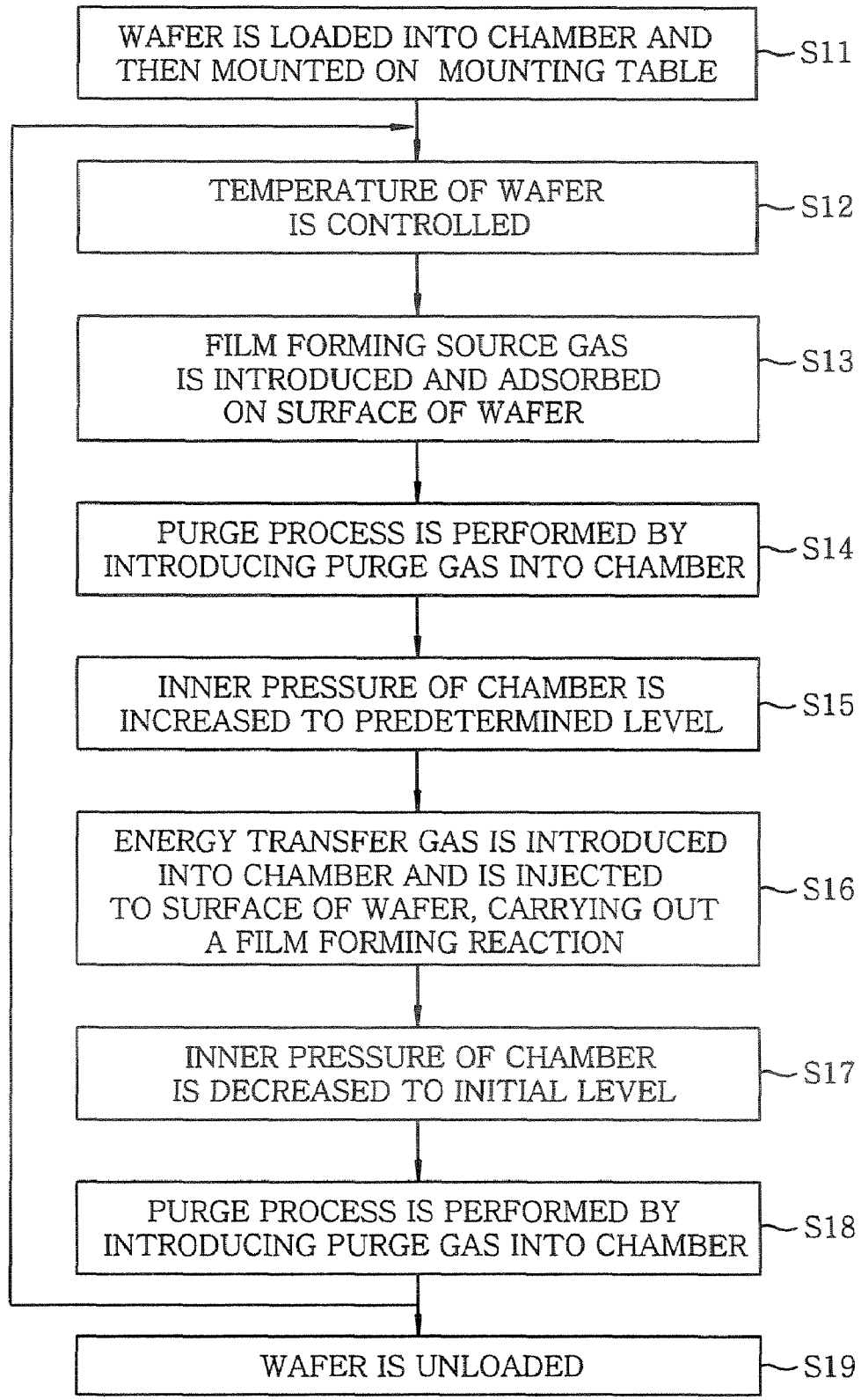
FIG. 4 presents a flowchart for explaining exemplary processes of a film forming method of the present invention.

Hereinafter, a sequence of forming a desired film by using the film forming apparatus 100 will be described with reference to FIG. 4. First of all, while a gate valve (not shown) is opened, the wafer W is loaded into the chamber 1 via the loading/unloading port and then mounted on the mounting table 3 (step S11). Next, a temperature control medium of a predetermined temperature is introduced into the temperature control medium chamber 30 and, also, a heat transfer gas such as He gas or the like is introduced into the gas channel 32. By injecting the heat transfer medium gas from the multiple injection openings 32a to the backside of the wafer W, a temperature of the wafer W is controlled until it reaches a level enabling the film forming material to be easily adsorbed on a surface of the wafer W (step S12). Although the temperature can vary depending on types of film forming material, it can be controlled between −20° C. and 100° C., for example.

The inside of the chamber 1 is exhausted by a vacuum pump of the gas exhaust unit 7. Next, while the valves 25a are opened, a source gas is supplied from the film forming source gas supply source 26 to the chamber 1 via the gas inlet port 17 at a flow rate controlled by the mass flow controller 24a. By performing the exhaust with an operation of the gas exhaust unit 7, the source gas flows from the gas inlet port 17 toward the gas exhaust port 5 in a direction parallel to the surface of the wafer W mounted on the mounting table 3, as indicated by white arrows of FIG. 1. Due to the flow of the source gas, the film forming material is physically or chemically adsorbed on the surface of the wafer W (step S13). Although an inner pressure of the chamber 1 during the adsorption process can vary depending on types of source materials, it is preferably controlled between 10 Pa and 1000 Pa, for example.

Thereafter, while the valves 25a are closed and the valves 25b are opened, the purge gas is supplied from the purge gas supply source 27 to the chamber 1 via the gas inlet port 17 at a flow rate controlled by the mass flow controller 24b. By performing the exhaust with an operation of the gas exhaust unit 7, the atmosphere inside the chamber 1 is substituted by the purge gas. Consequently, a residual gaseous source gas is removed (step S14).

Before an energy transfer gas is introduced into the chamber, an inner pressure of the chamber 1 is increased in a step S15. By increasing the pressure, when the energy transfer gas is introduced into the chamber in a next step 16, a temperature can be prevented from decreasing due to an expansion of the energy transfer gas and it is possible to suppress a desorption and a diffusion of the source gas adsorbed on the surface of the wafer W.

The pressure can be increased, under the control of the process controller 50, by constantly introducing the purge gas and adjusting an exhaust conductance with the use of the conductance variable valve 6a arranged on the gas exhaust line 6 between the gas exhaust port 5 and the gas exhaust unit 7. At this time, the gas exhaust unit 7 and the conductance variable valve 6a cooperatively serve as a pressure control unit. In the step S15 of increasing the pressure, it is preferable that the inner pressure of the chamber 1 is set to be between 500 Pa and 5000 Pa, for example.

It is preferable to carry out, after purging a certain amount of source gas by the purging step S14, the step S15 of increasing the inner pressure of the chamber 1 by using the purge gas and adjusting an exhaust amount through the use of the pressure control unit. However, the steps S14 and S15 can be simultaneously performed to reduce a processing time. In other words, upon the purge gas is introduced into the chamber 1, the pressure can be increased by controlling the exhaust amount with the use of pressure control unit.

Next, while the valves 25b are closed and the valves 22a are opened, the energy transfer gas is introduced from the energy transfer gas supply source 23a into the diffusion space 14 of the shower head 10 via the gas inlet port 12 at a flow rate controlled by the mass flow controller 21a. The energy transfer gas facilitates a film forming reaction by conveying thermal energy transferred thereto from the heating unit such as the heaters 15 or the like to the source gas adsorbed on the surface of the wafer W (substrate).

As indicated by black arrows of FIG. 1, the energy transfer gas introduced into the diffusion space 14 is substantially vertically injected to the surface of the wafer W through the multiple gas injection openings 11 disposed opposite to the wafer W in the lower portion of the shower head 10. At this time, the energy transfer gas is heated to a predetermined high temperature by the heaters 15 serving as the heating unit and thus collides against the surface of the wafer W with the sufficient thermal energy.

When starting introducing the energy transfer gas into the diffusion area 14 of the shower head 10, it is preferable to increase an input power to the heaters 15 rapidly so that the heat can be effectively conveyed to the energy transfer gas. Each of the heaters 15 is controlled by the process controller 50.

Although a heating temperature of the energy transfer gas may vary depending on target film types, it is preferably within the range from 300 to 1000° C., for example. Further, it is preferable to maintain the inner pressure of the chamber at the level obtained in the pressure increasing process (step S15) in view of effectively performing the film forming reaction.

Since the film forming material in the source gas is adsorbed on the surface of the wafer W as described above, the thermal energy required for the film forming reaction can be effectively supplied by injecting the high-temperature energy transfer gas thereto. Consequently, the film forming reaction is carried out on the surface of the wafer W, thereby forming a thin film corresponding to a monomolecular or a multimolecular adsorption layer of a source gas adsorbed on the surface of the wafer W (step S16). Moreover, the energy transfer gas can be heated in advance to a predetermined temperature by an external heating unit before being introduced into the shower head 10. At this time, the heaters 15 provided at the lower portion of the shower head 10 can serve as auxiliary heating units for final temperature regulation of the energy transfer gas.

When two or more types of gases are used as source gas to supply plural sepecies of metal elements, each of the gases may undergo the adsorption process of the step S13 and the purge process of the step S14. In addition to the energy transfer gas, a reactant gas chemically participating in the film forming reaction may be introduced in the reaction process of the step S16. That is, by opening the valves 22b, the reactant gas is introduced from the reactant gas supply source 23b into the diffusion space 14 of the shower head 10 at a flow rate controlled by the mass flow controller 21b and then injected into the chamber 1.

The reactant gas contains no metal elements in its molecular structure and is used to oxidize, reduce, carbonize and nitrify metal elements of a film forming material by reacting with the film forming material. As for the reactant gas, there can be used, e.g., an oxidizing gas ($O_2$, $O_3$, $H_2O$ or the like), a reduction gas ($H_2$, organic acid such as $HCOOH$, $CH_3COOH$ or the like, or alcohol such as $CH_3OH$, $C_2H_5OH$ or the like), a carbonization gas ($CH_4$, $C_2H_6$, $C_2H_4$, $C_2H_2$ or the like), a nitrification gas ($NH_3$, $NH_2NH_2$, $N_2$ or the like) or the like. The "reactant gas" of the present invention includes the aforementioned $H_2O$, organic acid, alcohol, $NH_2NH_2$ or the like, which is a liquid in a normal temperature and pressure condition. The elements forming the reactant gas may be incorporated into the film as a result of the reaction or may serve only to facilitate the reaction without being incorporated into the film. Whether to employ the reactant gas or not is determined depending on types of film forming materials and those of target films.

Further, by heating the reactant gas, the reactant gas can be used as the energy transfer gas.

After the reaction process of the step S16 is completed, it is preferable to stop the introduction of the energy transfer gas by closing the valves 22a and perform a pressure decreasing process for decreasing the inner pressure of the chamber 1 (step S17). By reducing the inner pressure of the chamber 1 after the reaction process, the energy transfer gas is exhausted and the energy supply to the surface of the wafer W is stopped in a short period of time. Further, by removing the heat from the surface of the wafer W, it is possible to prepare for a next source gas adsorption process and facilitate a desorption of by-products from the surface of the wafer W. Also, a gas purge process can be shortened by facilitating a discharge of gaseous by-products after the reaction.

The pressure reduction is performed, under the control of the process controller 50, for example, by exhausting the inside of the chamber 1 with the use of the gas exhaust unit 7, while fully opening the conductance variable valve 6a arranged on the gas exhaust line 6 between the gas exhaust port 5 and the gas exhaust unit 7. Herein, it is preferable to decrease the pressure as much as the increase in the pressure increasing process of the step S15. In this way, the pressure can be controlled to a level required in supplying the source gas for a next cycle.

Next, while the valves 25b are opened, the purge gas is supplied again from the purge gas supply source 27 into the chamber 1 via the gas inlet port 17 at a flow rate controlled by the mass flow controller 24b. Then, the atmosphere inside the chamber 1 is substituted by a low temperature purge gas by exhausting the inside of the chamber 1 with the gas exhaust unit 7. Accordingly, the thermal energy conveyed by the energy transfer gas is removed and, also, reaction by-products existing in the gas phase or absorbed on the surface of the wafer W are removed (step S18). In other words, the heat is removed from the surface of the wafer W by purging the energy transfer gas in the purge process of the step S18. As a result, it is possible to prepare for a source gas adsorption process of a next cycle. Further, a concentration of impurities in the film can be decreased by purging the gaseous reaction by-products.

In the film forming apparatus 100, a high-quality thin film corresponding to a monomolecular or a multimolecular adsorption layer of a film forming material can be formed on the wafer W by performing main processes including the adsorption process for adsorbing the film forming material on the surface of the wafer W, the purge process for substituting the atmosphere inside the chamber with the purge gas and the reaction process for carrying out the film forming reaction by supplying the thermal energy to the film forming material on the surface of the wafer W through the use of the energy transfer gas. Therefore, thin films can be sequentially deposited on the surface of the wafer W by repetitively performing the processes of the steps S12 to S18 in FIG. 4. The pressure increasing process of the step S15 and the pressure decreasing process of the step S17 are not prerequisite processes for the film formation. In other words, it is possible to perform the purge process of the step S14, the reaction process of the step S16 and the purge process of the step S18 while maintaining the inner pressure of the chamber 1 at a constant level.

After a desired film of a predetermined thickness is formed, the wafer W is unloaded from the loading/unloading port (not shown) by opening the gate valve (not shown) (step S19). In this way, the film forming process for a single wafer W is completed.

Figure 5:
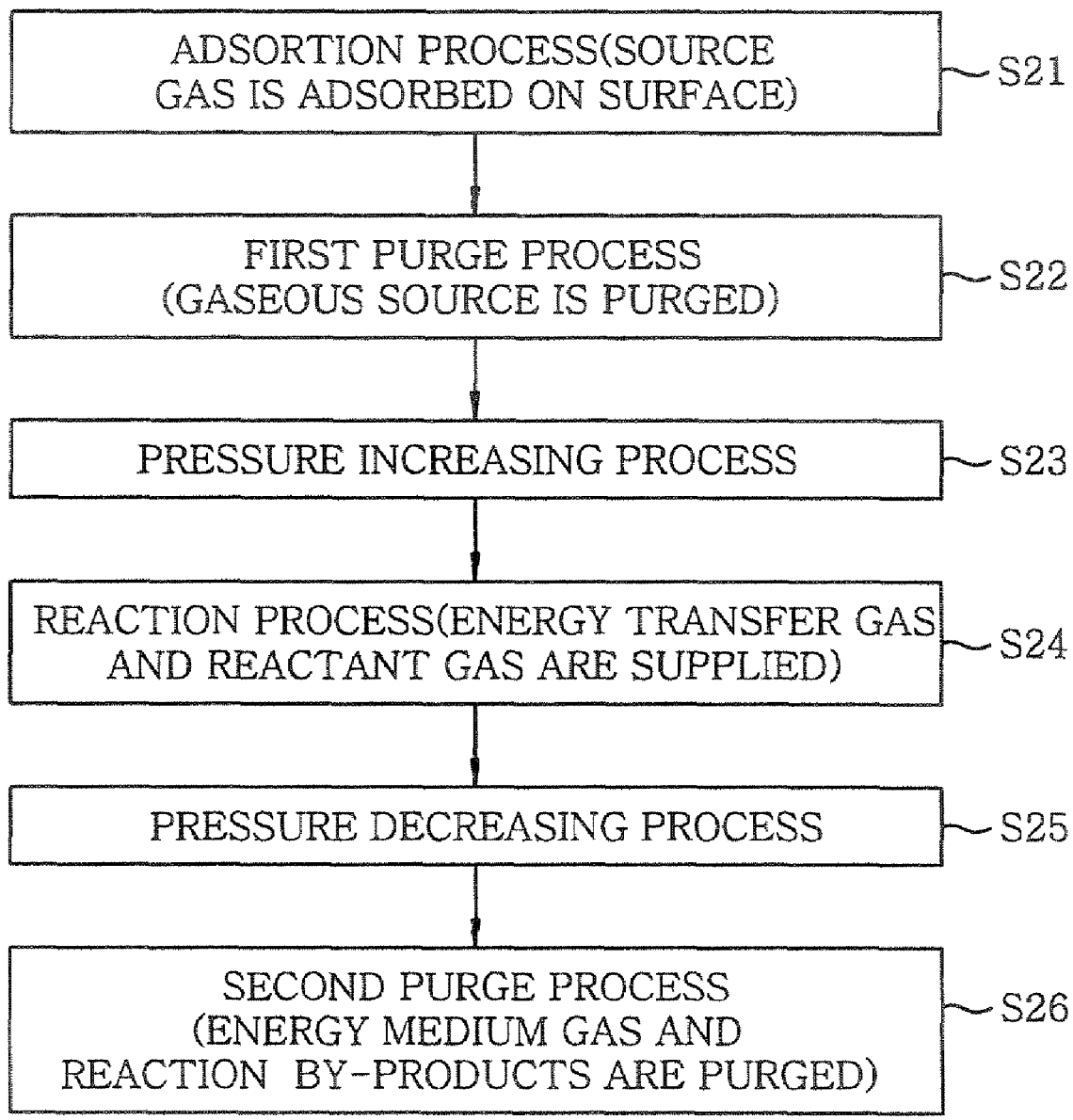
FIG. 5 represents a flowchart for explaining another exemplary processes of the film forming method of the present invention.
Figure 6:
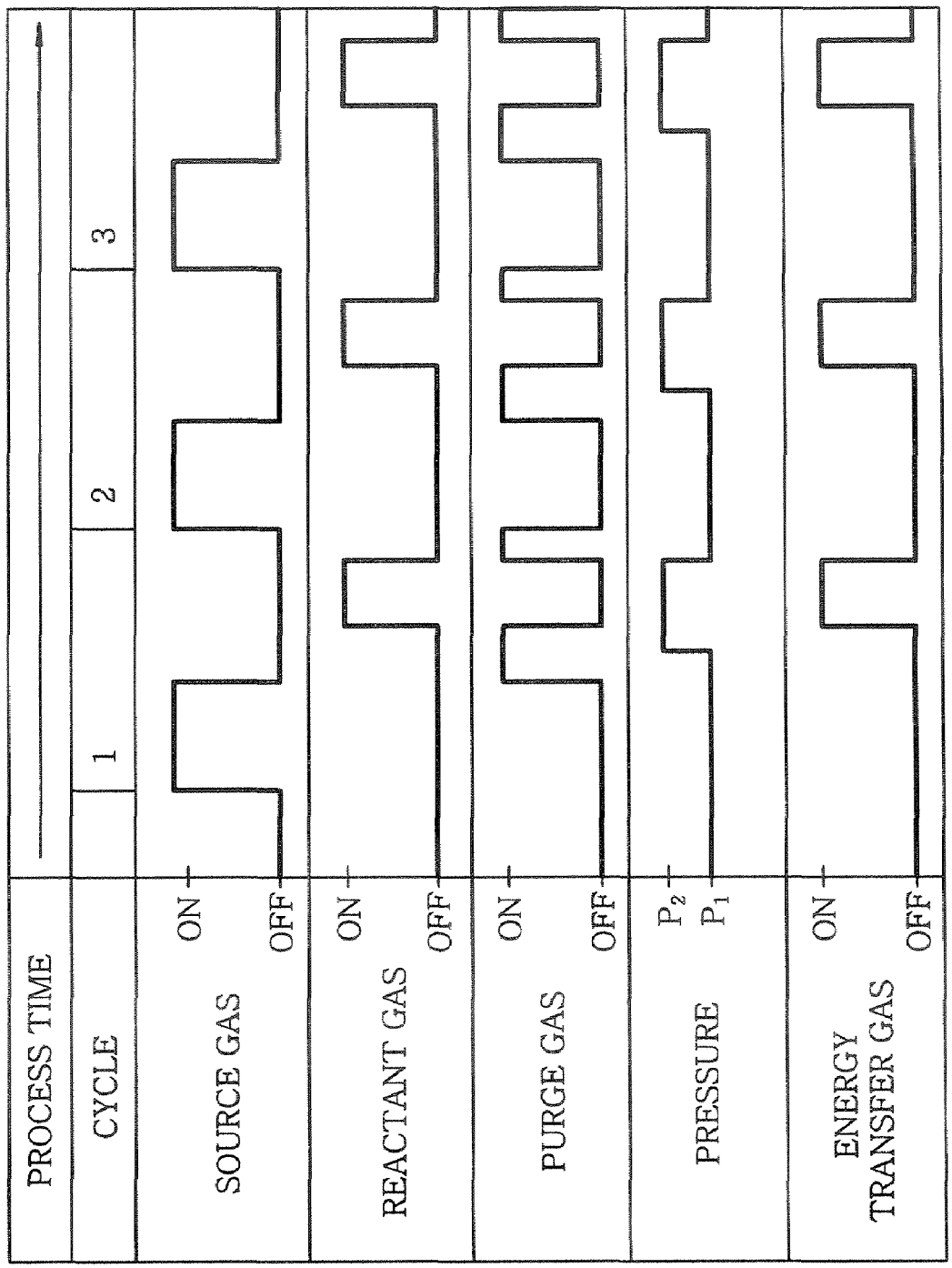
FIG. 6 depicts a timing chart of the exemplary processes of FIG. 5.

Hereinafter, examples of major processes of the film forming method of the present invention will be described with reference to FIGS. 5 to 10. FIG. 5 provides a flowchart showing an example of a film forming reaction performed by introducing into the chamber 1 a reactant gas in addition to an energy transfer gas during a reaction process. FIG. 6 offers a timing chart based on the flowchart of FIG. 5. Although FIG. 6 illustrates only a first to a third cycle for convenience, the number of cycles may be one or more than four depending on desired thin films (same in FIGS. 8, 10 and 14 to 21). Since the details of each process are the same as those described above, the description thereof will be omitted.

First of all, a source gas is adsorbed on a surface of a wafer W in a step S21. At this time, it is preferable that a temperature of the wafer W is controlled in advance as described above.

Next, a first purge process is performed to purge a gaseous source gas in a step S22 (gaseous source gas purge process). Then, an inner pressure of the chamber 1 is increased by controlling an exhaust conductance while introducing the purge gas in a pressure increasing process of a step S23.

Herein, the purge process of the step S22 and the pressure increasing process of the step S23 are overlapped temporally. In a reaction process of a step S24, a film forming reaction is carried out by simultaneously supplying to the chamber a reactant gas in addition to an energy transfer gas.

In a step 25, the introduction of the energy transfer gas and the reactant gas is stopped and, also, the inner pressure of the chamber 1 is decreased to a level before the pressure increasing process. Then, a second purge process is performed to purge reaction by-products and the energy transfer gas having the thermal energy (step S26).

One cycle of the aforementioned steps S21 to S26 is repeated multiple times as necessary. Herein, the first purge process of the step S22 and the pressure increasing process of the step S23 can be performed simultaneously. Further, the pressure decreasing process of the step S25 and the second purge process of the step S26 can be performed simultaneously.

Figure 7:
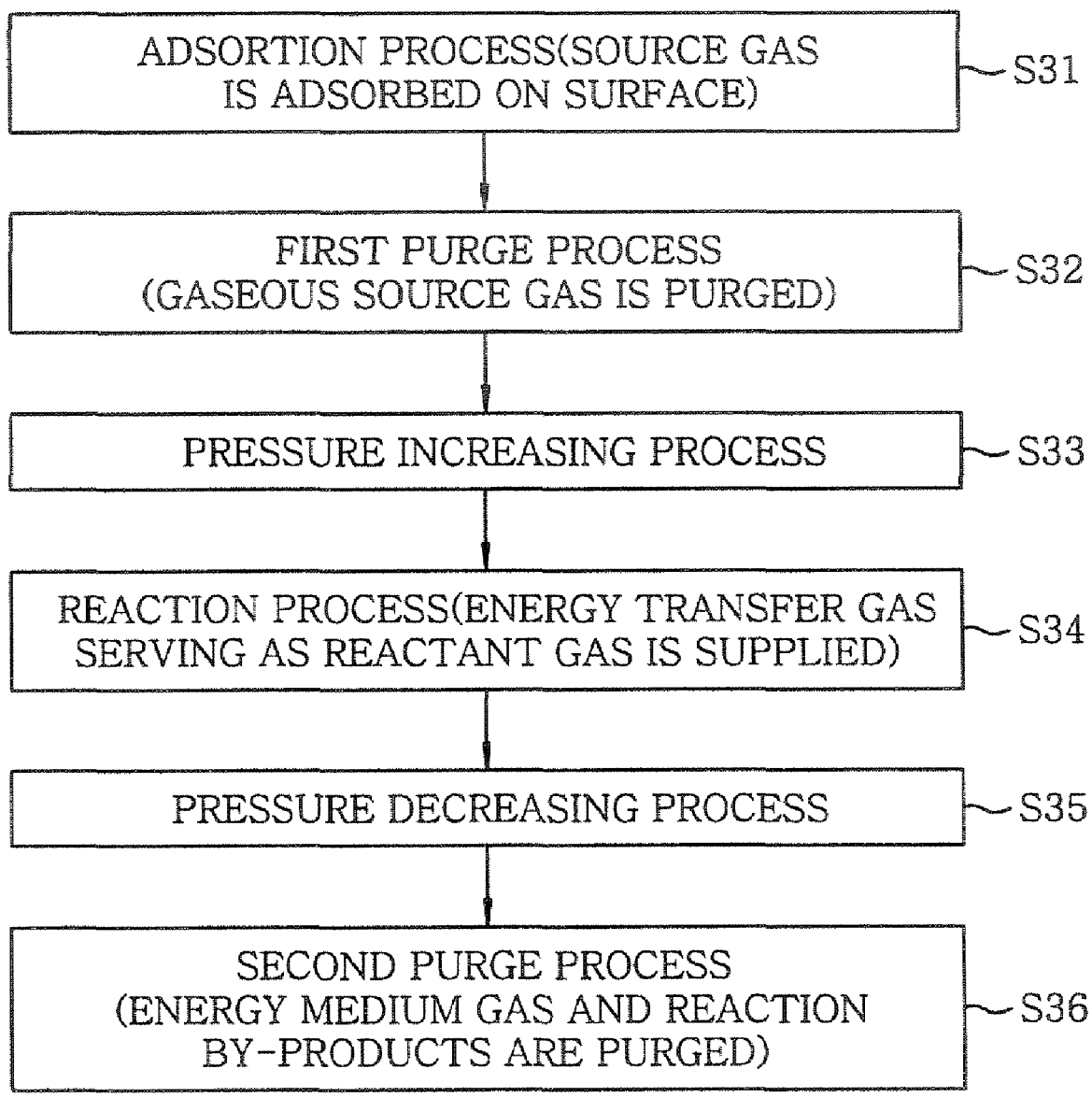
FIG. 7 provides a flowchart for explaining still another exemplary processes of the film forming method of the present invention.
Figure 8:
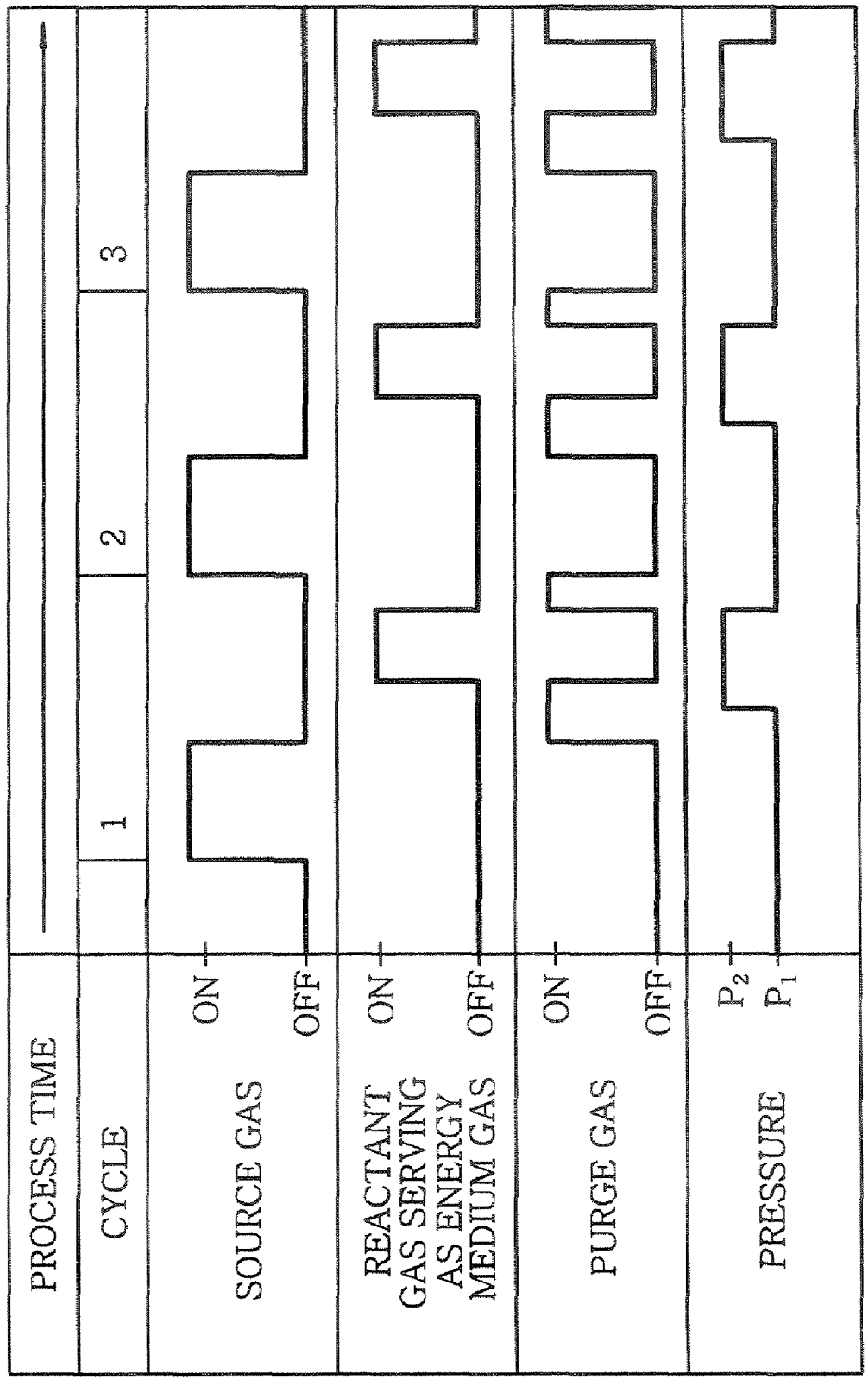
FIG. 8 describes a timing chart of the exemplary processes of FIG. 7.

FIG. 7 presents a flowchart describing an example of a film forming reaction performed by introducing into the chamber 1 a reactant gas serving as an energy transfer gas. That is, the heated reactant gas can be used as the energy transfer gas. FIG. 8 represents a timing chart based on the flowchart of FIG. 7. Since the details of each process are the same as those described above, the description thereof will be omitted.

First of all, a source gas is adsorbed on a surface of a wafer W in a step S31. At this time, it is preferable that a temperature of the wafer W is controlled in advance as described above.

Next, a first purge process is performed to purge a gaseous source gas in a step S32 (gaseous source gas purge process). Then, an inner pressure of the chamber 1 is increased by controlling an exhaust conductance while introducing the purge gas in a pressure increasing process of a step S33. Herein, the purge process of the step S32 and the pressure increasing process of the step S33 are overlapped temporally. In a reaction process of a step S34, a film forming reaction is carried out by supplying to the chamber an energy transfer gas serving as a reactant gas. As for the energy transfer gas serving as the reactant gas, there can be employed, e.g., $H_2$, $NH_3$, $N_2$, $N_2H_4$, $HCOOH$, $CH_3COOH$, $CH_3OH$, $H_2O$ (vapor), $O_3$, $CO$ and the like.

In a step 35, the introduction of the energy transfer gas is stopped and, also, the inner pressure of the chamber 1 is decreased to a level before the pressure increasing process. Then, a second purge process is performed to purge reaction by-products and the energy transfer gas having the thermal energy (step S36).

One cycle of the aforementioned steps S31 to S36 is repeated multiple times as necessary. Herein, the first purge process of the step S32 and the pressure increasing process of the step S33 can be performed simultaneously. Further, the pressure decreasing process of the step S35 and the second purge process of the step S36 can be performed simultaneously.

Figure 9:
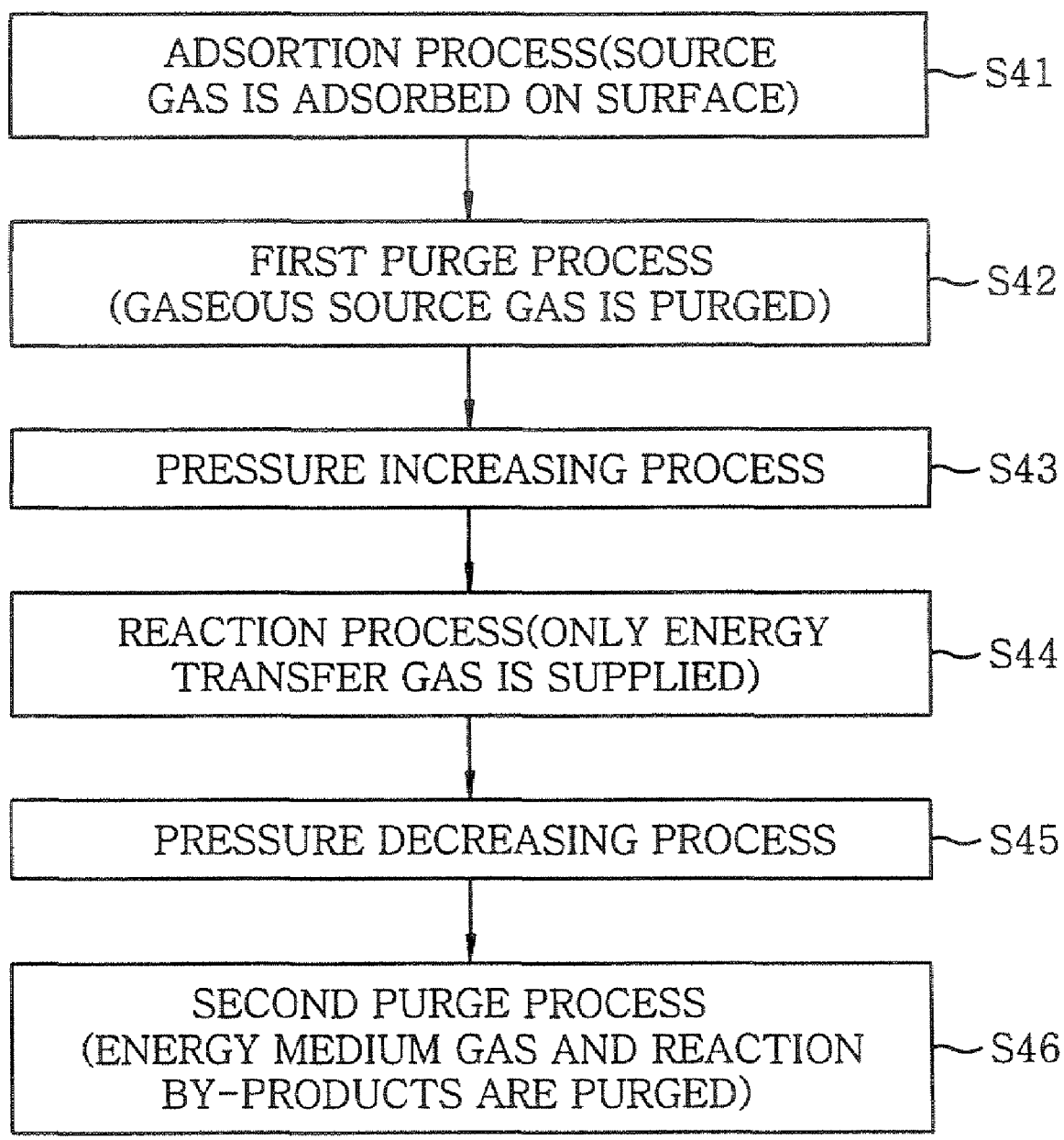
FIG. 9 is a flowchart for explaining still another exemplary processes of the film forming method of the present invention.
Figure 10:
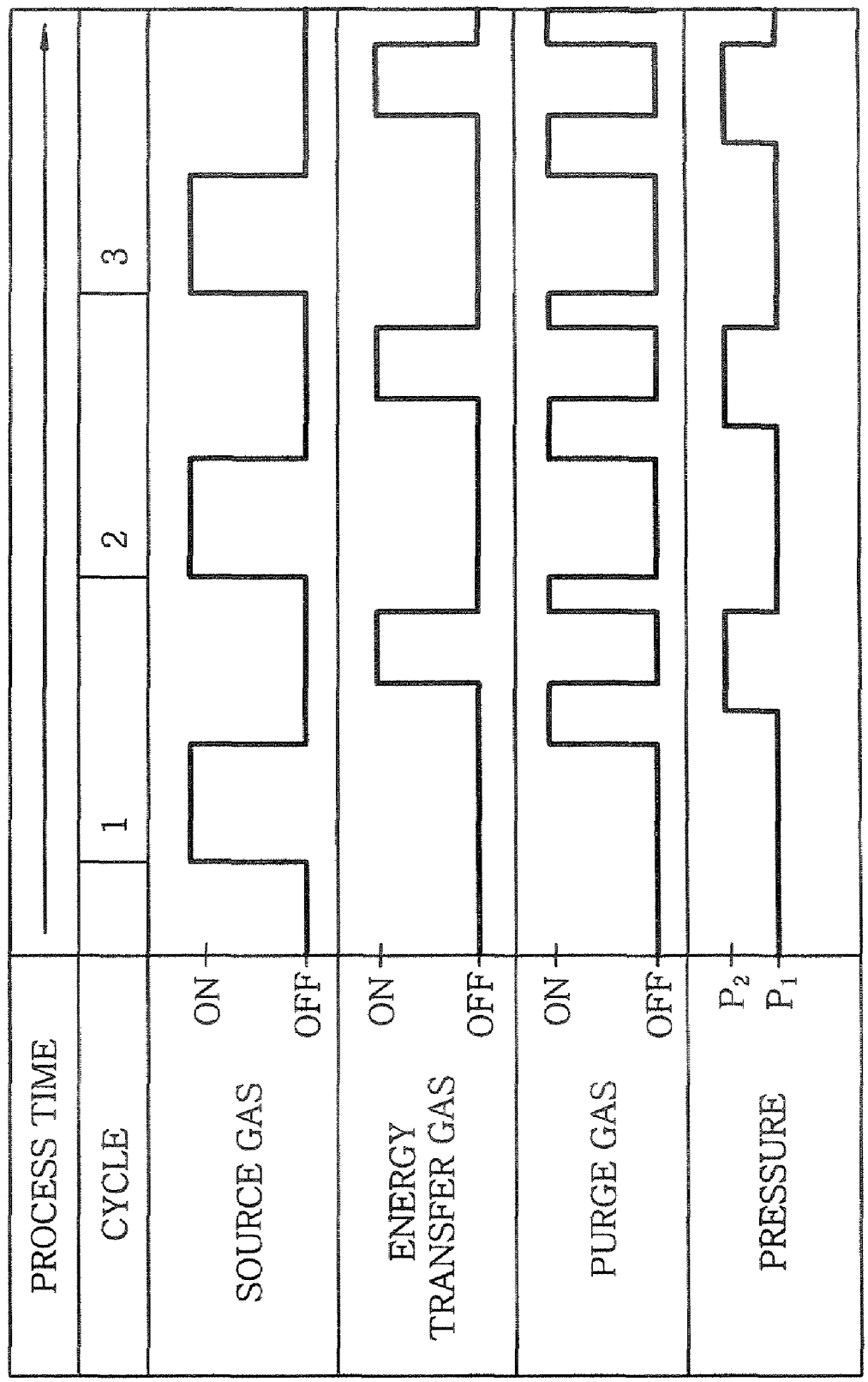
FIG. 10 shows a timing chart of the exemplary processes of FIG. 9.

FIG. 9 is a flowchart showing an example of a film forming reaction performed by introducing only an energy transfer gas into the chamber 1 during a reaction process. This is for a case where the film forming reaction is carried out by only supplying the thermal energy by the energy transfer gas without having to use the reactant gas. FIG. 10 illustrates a timing chart based on the flowchart of FIG. 9. Since the details of each process are the same as those described above, the description thereof will be omitted.

First of all, a source gas is adsorbed on a surface of a wafer W in a step S41. In such a case, it is preferable that a temperature of the wafer W is controlled in advance as described above.

Next, a first purge process is performed to purge a gaseous source gas in a step S42 (gaseous source gas purge process). Then, an inner pressure of the chamber 1 is increased by controlling an exhaust conductance while introducing the purge gas in a pressure increasing process of a step S43. Herein, the purge process of the step S42 and the pressure increasing process of the step S43 are overlapped temporally. In a reaction process of a step S44, a film forming reaction is carried out by supplying only the energy transfer gas into the chamber.

In a step 45, the introduction of the energy transfer gas is stopped and, also, the inner pressure of the chamber 1 is decreased to a pressure level before the pressure increasing process. Then, a second purge process is performed to purge reaction by-products and the energy transfer gas having the thermal energy (step S46).

One cycle of the aforementioned steps S41 to S46 is repeated multiple times as necessary. Herein, the first purge process of the step S42 and the pressure increasing process of the step S43 can be performed simultaneously. Further, the pressure decreasing process of the step S45 and the second purge process of the step S46 can be performed simultaneously.

Figure 11A:
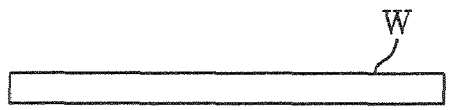
FIGS. 11A to 11J illustrate schematic views for explaining a principle of the film forming method of the present invention.
Figure 11B:
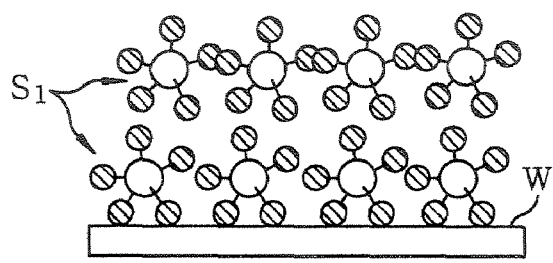
Figure 11C:
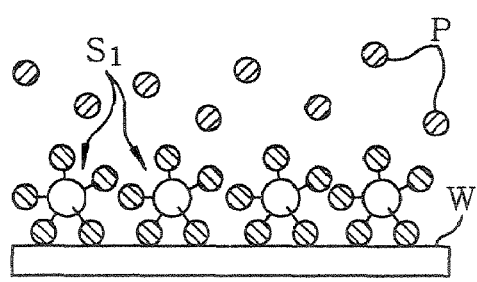
Figure 11D:
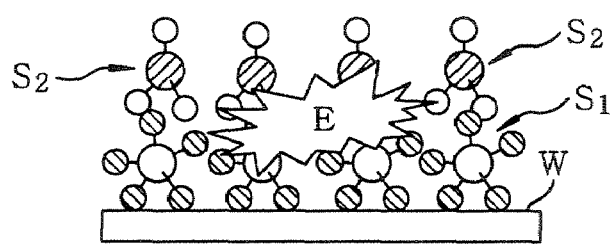
Figure 11E:
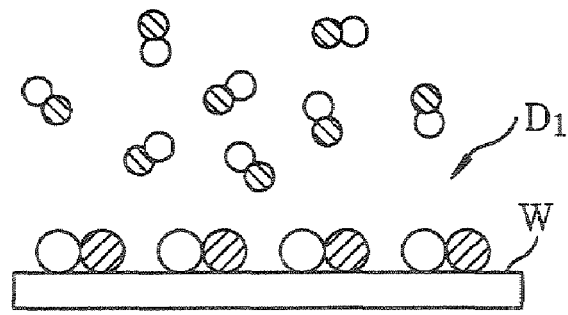

FIGS. 11A to 11J schematically illustrate a principle of a film forming process of this embodiment. FIG. 11A shows a wafer W having a temperature controlled to a level at which a source material can be easily adsorbed. Referring to FIG. 11B, a source material $S_1$ is adsorbed by contacting a source gas on a surface of the wafer W having the temperature controlled to a predetermined level. Next, as shown in FIG. 11C, the residual gaseous source material $S_1$ is removed by performing a purge process with a purge gas P. After an inner pressure of the chamber 1 is increased if necessary, a thermal energy E required for a reaction is supplied by injecting a reactant gas $S_2$ and an energy transfer gas (not shown) heated to a high temperature toward the wafer W having the source material $S_1$ adsorbed thereon, as illustrated in FIG. 11D. In this example, a chemical reaction takes place between the source material $S_1$ and the reactant gas $S_2$, thereby forming a first layer of thin film $D_1$, as shown in FIG. 11E. Herein, the reactant gas $S_2$ may not be used if not required.

Figure 11F:
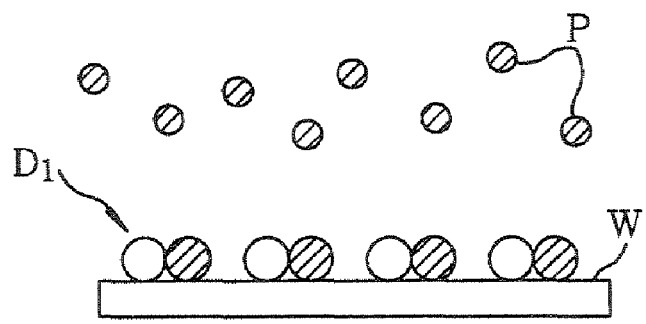
Figure 11G:
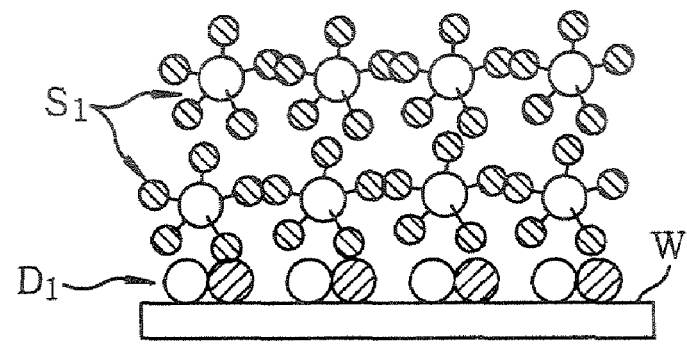
Figure 11H:
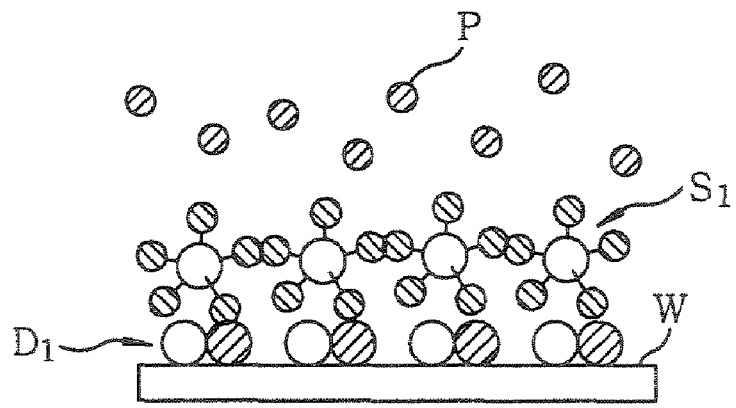
Figure 11I:
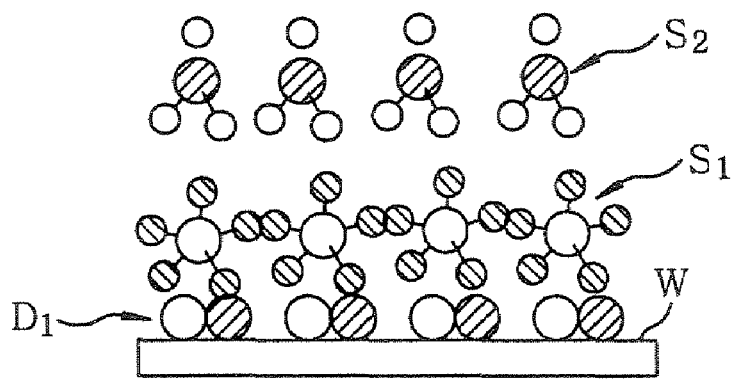
Figure 11J:
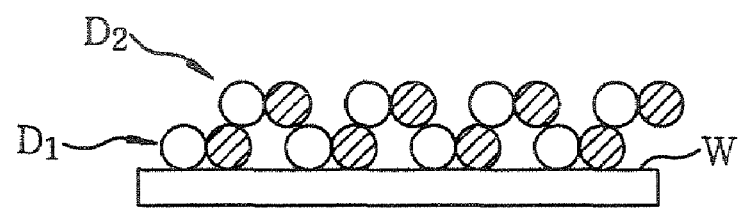

After the inner pressure of the chamber 1 is decreased to a level before the pressure increasing process if necessary, the energy transfer gas having the thermal energy or the reaction by-products are removed by carrying out the purge process with the purge gas P, as illustrated in FIG. 11F. Therefore, in order to deposit a second layer of thin film, the source material $S_1$ is adsorbed again on the wafer W (on the thin film $D_1$) (FIG. 11G) and, then, the purge process is performed (FIG. 11H). After increasing the inner pressure of the chamber 1 if necessary, the reactant gas $S_2$ and the energy transfer gas are injected (FIG. 11I). As a result, a chemical reaction takes place, forming a second layer of thin film $D_2$ (FIG. 11J). Since the subsequent processes are the same as those for the first layer film forming process, the description thereof will be omitted. By repetitively performing the aforementioned processes, further layers of thin films are sequentially formed on top of the surface of the wafer W until a desired film thickness is achieved. Although FIGS. 11A to 11J depict an example in which the film is formed by supplying the energy to a monomolecular adsorption layer adsorbed on the wafer W, a thin film can be deposited by supplying the energy to a multimolecular adsorption layer.

Figure 12:
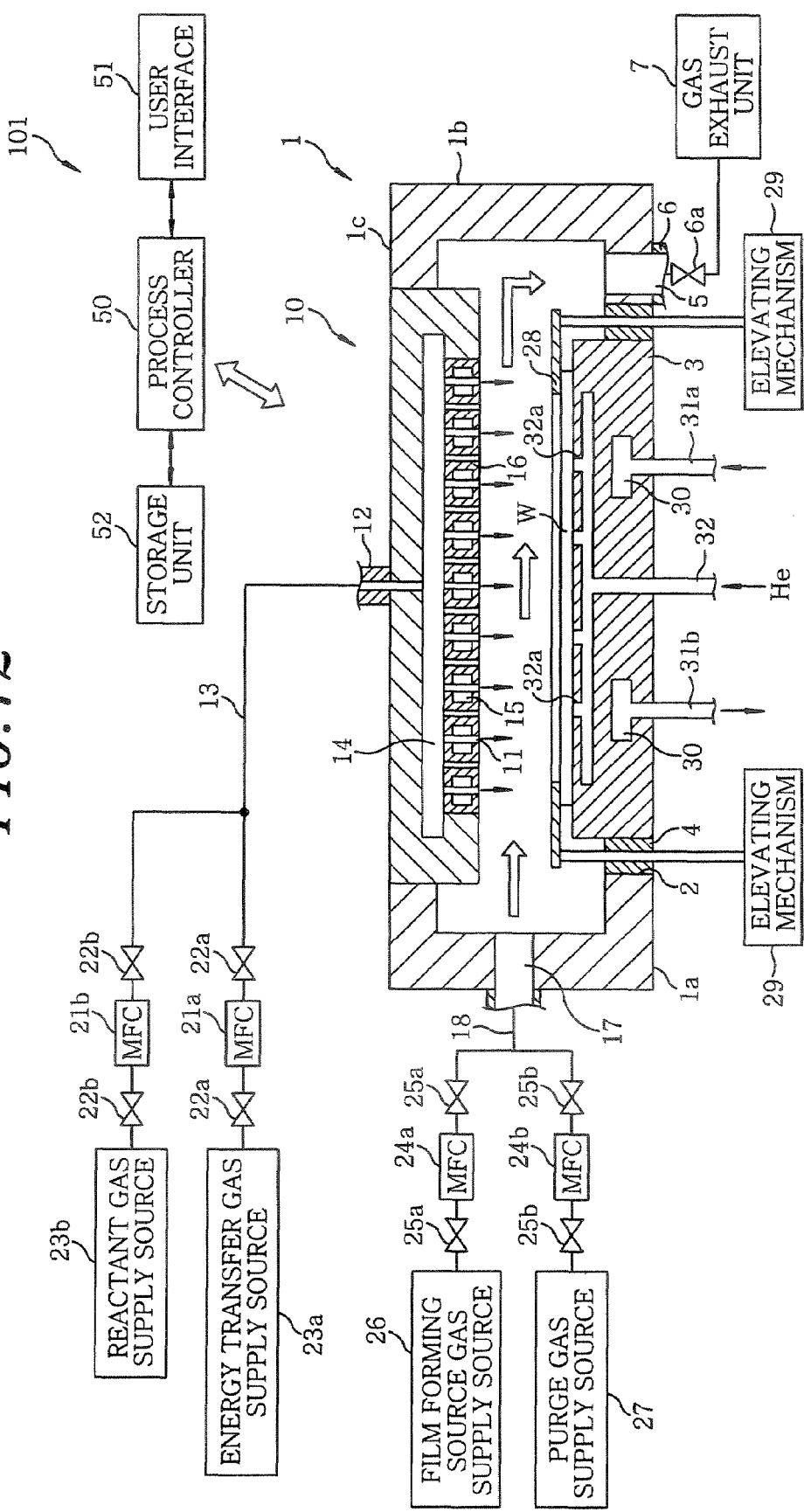
FIG. 12 presents a schematic configuration of a film forming apparatus in accordance with a second embodiment of the present invention.

FIG. 12 is a cross sectional view illustrating a schematic configuration of a film forming apparatus 101 in accordance with a second embodiment of the present invention. The film forming apparatus 101 is different from the film forming apparatus 100 of the first embodiment in that a gas exhaust port 5 is formed on a bottom wall 1a of a chamber 1 and connected with a gas exhaust unit 7 via a gas exhaust line 6 connected therewith, the gas exhaust unit 7 having a high speed vacuum pump. It is preferable that the gas exhaust port 5 and the gas inlet port 17 are located at diametrically opposite locations with respect to the mounting table 3. A conductance variable valve 6a serving as a pressure control unit is arranged on the gas exhaust line 6 between the gas exhaust port 5 and the gas exhaust unit 7. By exhausting a gas inside the chamber 1 with an operation of the gas exhaust unit 7, an inner pressure of the chamber 1 can be decreased to a predetermined vacuum level at a high speed via the gas exhaust line 6 while controlling the pressure. Although the gas exhaust port 5 is disposed as shown in FIG. 12, a flow of the source gas can be formed from the gas inlet port 17 toward the gas exhaust port 5 in a direction parallel to the surface of the wafer W mounted on the mounting table 3, as indicated by white arrows of FIG. 12. Consequently, the film forming source material can be effectively adsorbed on the surface of the wafer W. Since other configurations of the film forming apparatus 101 in accordance with the second embodiment are the same as those of the film forming apparatus of the first embodiment, like reference numbers are given to like parts and the description thereof will be omitted.

Figure 13:
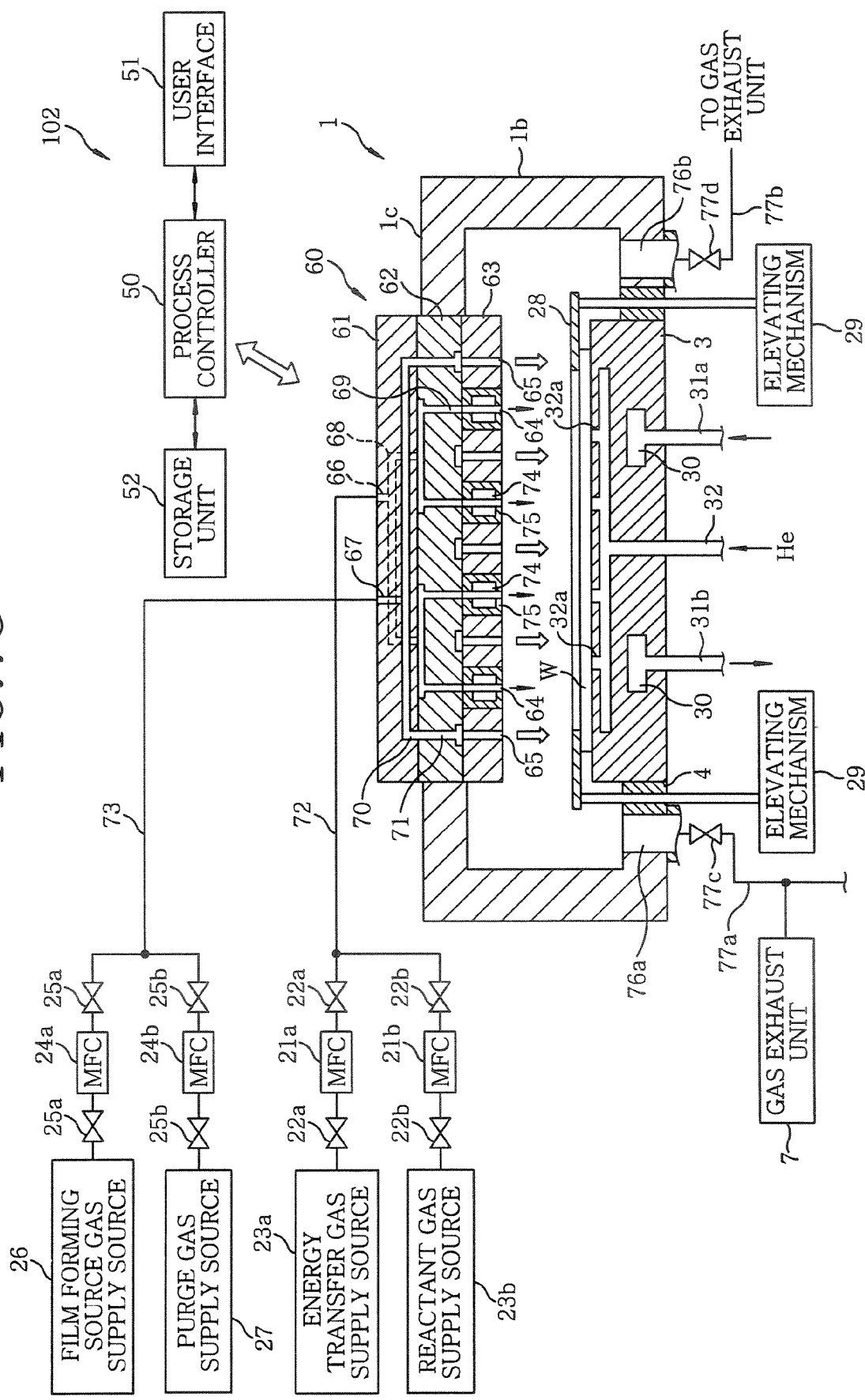
FIG. 13 represents a schematic configuration of a film forming apparatus in accordance with a third embodiment of the present invention.

FIG. 13 provides a cross sectional view showing a schematic configuration of a film forming apparatus 102 in accordance with a third embodiment of the present invention. Unlike the film forming apparatus 100 of the first embodiment or the film forming apparatus 101 of the second embodiment, the film forming apparatus 102 employs a structure in which a source gas, a purge gas, a reactant gas and an energy transfer gas are all supplied via a shower head.

To be specific, a shower head 60 is provided on a ceiling wall 1c of the chamber 1 and includes an upper block body 61, an intermediate block body 62 and a lower block body 63. Alternately formed in the lower block body 63 are gas injection openings 64 and 65 for discharging gases. A first and a second gas inlet port 66 and 67 are formed on a top surface of the upper block body 61. The first gas inlet port 66 is connected with an energy transfer gas supply source 23a and a reactant gas supply source 23b via a bifurcated gas line 72. The second gas inlet port 67 is connected with a film forming source gas supply source 26 and a purge gas supply source 27 via a bifurcated gas line 73. Moreover, the heated reactant gas can be used as the energy transfer gas. In such a case, the energy transfer gas supply source 23a does not need to be provided in addition to the reactant gas supply source 23b.

A plurality of gas channels 68 are branched from the first gas inlet port 66 inside the upper block body 61. Further, gas channels 69 are formed in the intermediate block body 62 and the gas channels 68 communicate with the gas channels 69. Furthermore, the gas channels 69 communicate with the gas injection openings 64 of the lower block body 63.

Moreover, a plurality of gas channels 70 are branched from the second gas inlet port 67 inside the upper block body 61. In addition, gas channels 71 are formed in the intermediate block body 62 and the gas channels 70 communicate with the gas channels 71. The gas channels 71 communicate with the gas injection openings 65 of the lower block body 63.

Provided around the gas injection openings 64 are heaters 74 serving as heating units for heating the energy transfer gas and the reactant gas inside the shower head 60. Further, insulating units 75 are provided around the heaters 74 to insulate the heaters 74, the insulating units 75 being made of a material having a low thermal conductivity, e.g., heat resistant synthetic resin, quartz, ceramic or the like.

Gas exhaust ports 76a and 76b are formed on a bottom wall 1a of the chamber 1, e.g., at diametrically opposite locations with respect to the mounting table 3 and connected with a gas exhaust unit 7 having a high speed vacuum pump via gas exhaust lines 77a and 77b connected therewith. By exhausting a gas inside the chamber 1 with an operation of the gas exhaust unit 7, an inner pressure of the chamber 1 can be decreased to a predetermined vacuum level at a high speed via the gas exhaust lines 77a and 77b. Moreover, the pressure can be controlled to be increased or decreased by adjusting an exhaust conductance with the conductance variable valves 77c and 77d arranged on the gas exhaust lines 77a and 77b between the gas exhaust ports 76a and 76b and the gas exhaust unit 7 under the control of the process controller 50. At this time, the gas exhaust unit 7 and the conductance variable valves 77c and 77d cooperatively serve as a pressure control unit.

By connecting the gas line 73 with the shower head 60 as shown in FIG. 13, the source gas from the film forming source gas supply source 26 is discharged through the gas injection openings 65 of the lower block body 63 facing the wafer W via the second gas inlet port 67 and the gas channels 70 and 71. Accordingly, the source gas can collide against the surface of the wafer W in a substantially vertical direction. Further, by exhausting the gas in the chamber 1 through the gas exhaust ports 76a and 76b formed on the bottom wall 1a of the chamber 1, the source gas that has collided against the surface of the wafer W can flow toward the gas exhaust ports 76a and 76b in a direction substantially parallel to the surface of the wafer W mounted on the mounting table 3. Consequently, the film forming material can be effectively adsorbed on the surface of the wafer W.

By connecting the gas line 72 with the shower head 60, the energy transfer gas from the energy transfer gas supply source 23a and the reactant gas from the reactant gas supply source 23b are discharged, if necessary, through the gas injection openings 64 of the lower block body 63 facing the wafer W via the first gas inlet port 66 and the gas channels 68 and 69. Accordingly, the energy transfer gas and the reactant gas collide against the surface of the wafer W in a substantially vertical direction. As a result, the thermal energy can be effectively supplied to the surface of the wafer W where the reaction takes place.

Since other configurations of the film forming apparatus 102 of the third embodiment are the same as those of the film forming apparatus 100 of the first embodiment, like reference numbers are given to like parts and, further, the description thereof will be omitted.

Hereinafter, the present invention will be described in detail based on examples. However, the present invention is not limited to following examples.

EXAMPLE 1

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C.

A liquid source material of Ru(EtCp)$_2$ was introduced into a vaporizer heated to 150° C. and, then, the vaporized gas was introduced into the vacuum film forming apparatus by a carrier gas of Ar. As for an oxidizing gas (reactant gas) O$_2$ was used. Introduced into the chamber 1 were Ru(EtCp)$_2$, Ar serving as a carrier and dilution gas; and O$_2$ serving as a reactant gas and Ar serving as an energy transfer gas heated to a high temperature for a film forming reaction.

Figure 14:
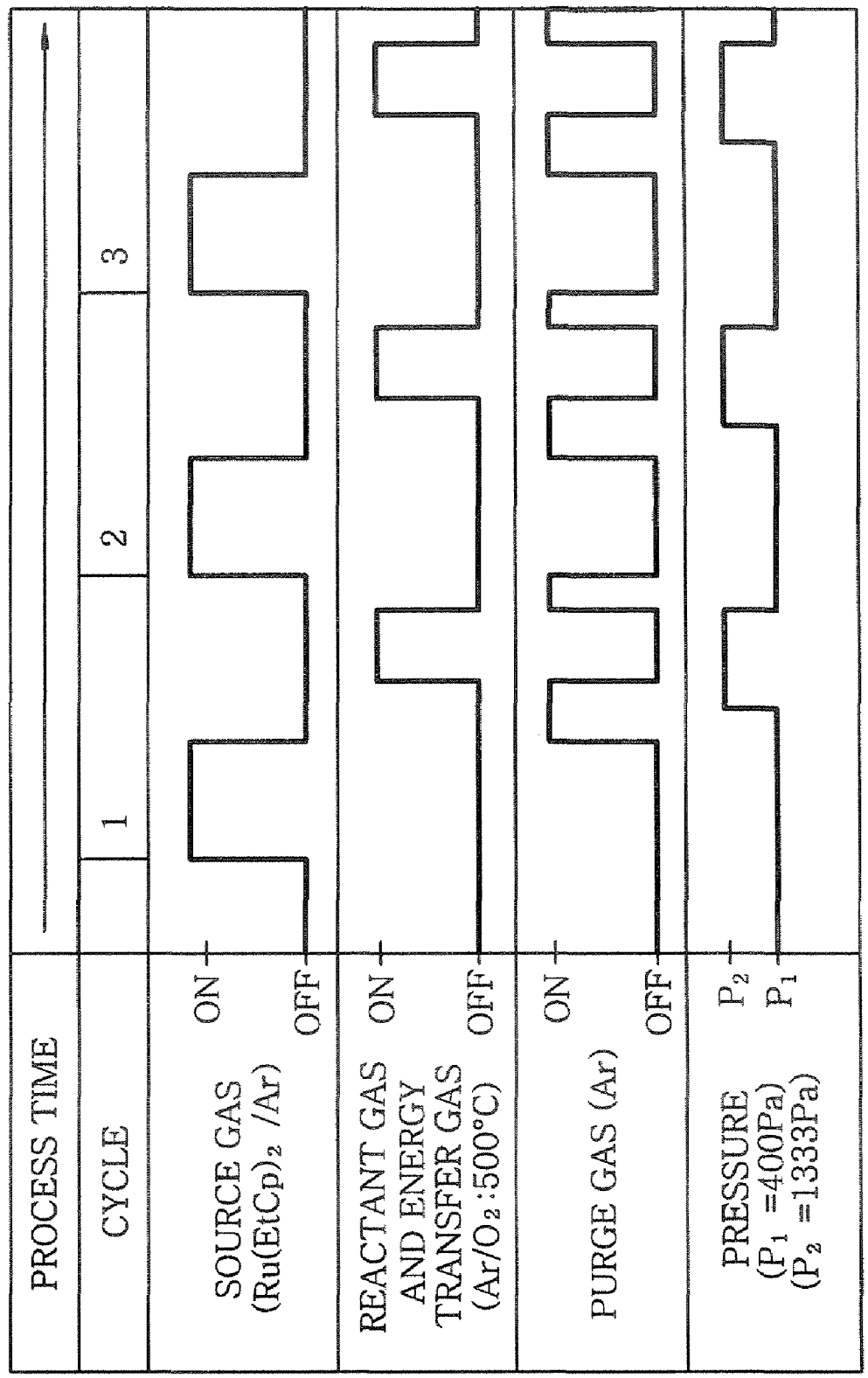
FIG. 14 describes a timing chart of a film formation of a first example.

Next, a film forming process was carried out by performing following steps 1 to 4. FIG. 14 shows a timing chart of the film forming process in this example:

Step 1;

$Ru(EtCp)_2$ of 0.1 g/min and the carrier gas of Ar of 100 mL/min (sccm) were set to flow for 20 seconds while setting an inner pressure of the chamber at 400 Pa (3 Torr), Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing, Step 3;

Ar and $O_2$, each being heated to 500° C., were set to flow for 10 seconds while setting the inner pressure of the chamber at 1333 Pa (10 Torr). Each of the flow rates of Ar and $O_2$ was 500 mL/min (sccm).

Step 4;

A purge process was performed by flowing a dilution gas of Ar of 1000 mL/min (sccm) as a purge gas for 10 seconds while setting the inner pressure of the chamber at 400 Pa (3 Torr).

By repeating the steps 1 to 4 ten times, a Ru film having a film thickness of 30 nm was formed.

EXAMPLE 2

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C.

A liquid source material of $Ru(EtCp)_2$ was introduced into a vaporizer heated to 150° C. and, then, the vaporized gas was introduced into the vacuum film forming apparatus by a carrier gas of Ar. Introduced into the chamber 1 were $Ru(EtCp)_2$, Ar serving as a carrier and dilution gas; and $H_2$ serving as a reactant gas and Ar as an energy transfer gas heated to a high temperature for a film forming reaction.

Figure 15:
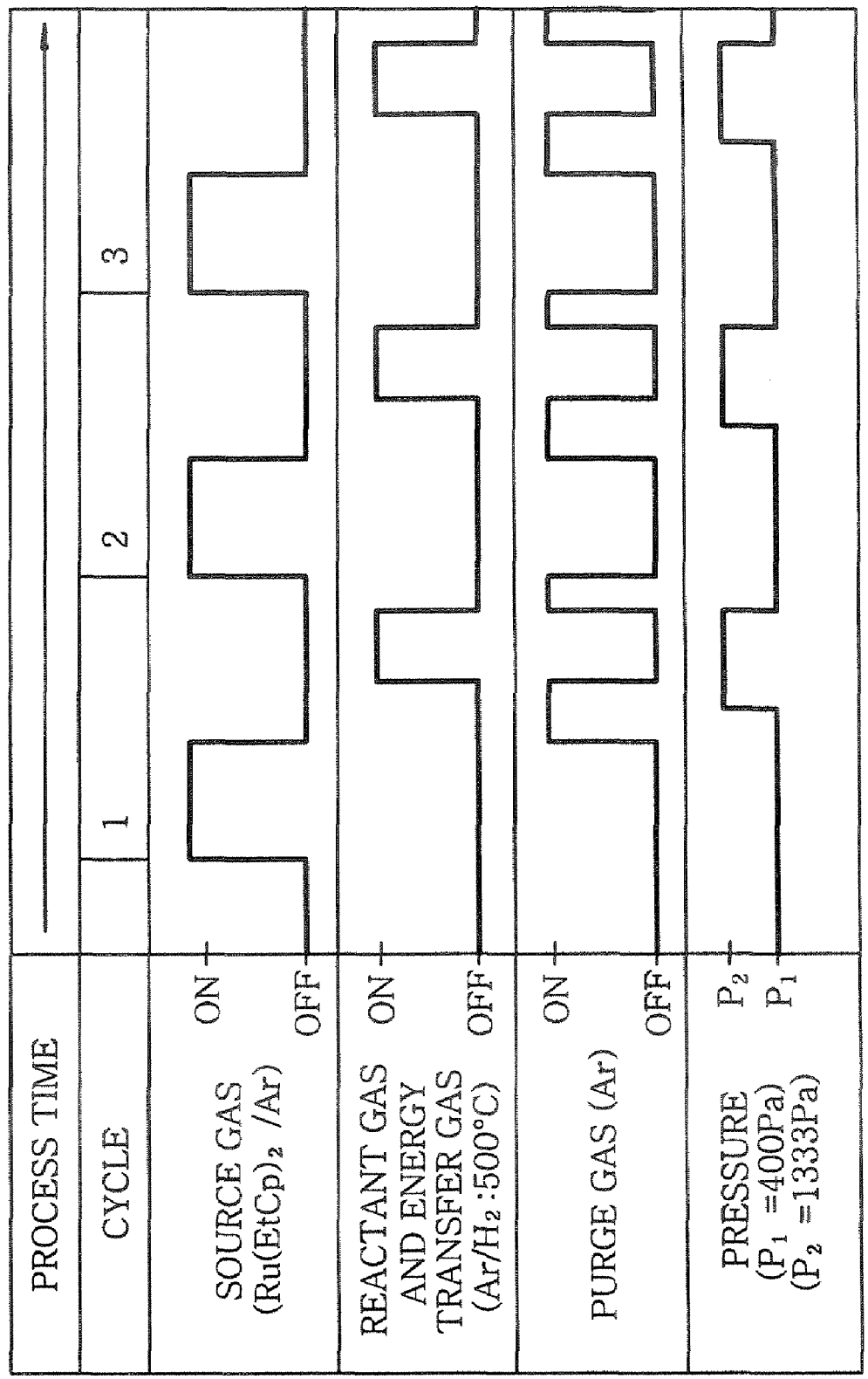
FIG. 15 illustrates a timing chart of a film formation of a second example.

Next, a film forming process was carried out by performing following steps 1 to 4. FIG. 15 shows a timing chart of the film forming process in this example:

Step 1;

$Ru(EtCp)_2$ of 0.2 g/min and the carrier gas of Ar of 100 mL/min (sccm) were set to flow for 20 seconds while setting an inner pressure of the chamber at 400 Pa (3 Torr).

Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing, Step 3;

Ar and $H_2$, each being heated to 500° C., were set to flow for 10 seconds while setting the inner pressure of the chamber at 1333 Pa (10 Torr). Each of the flow rates of Ar and $H_2$ was 500 mL/min (sccm).

Step 4;

A purge process was carried out by flowing a dilution gas of Ar of 1000 mL/min (sccm) as a purge gas for 10 seconds while setting the inner pressure of the chamber at 400 Pa (3 Torr).

By repeating the steps 1 to 4 eight times, a Ru film having a film thickness of 27 nm was formed.

EXAMPLE 3

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C.

A liquid source material of $Ru(EtCp)_2$ was introduced into a vaporizer heated to 150° C. and, then, the vaporized gas was introduced into the vacuum film forming apparatus by a carrier gas of Ar. Introduced into the chamber 1 were $Ru(EtCp)_2$, Ar serving as a carrier and dilution gas; and Ar serving as an energy transfer gas heated to a high temperature for a film forming reaction.

Figure 16:
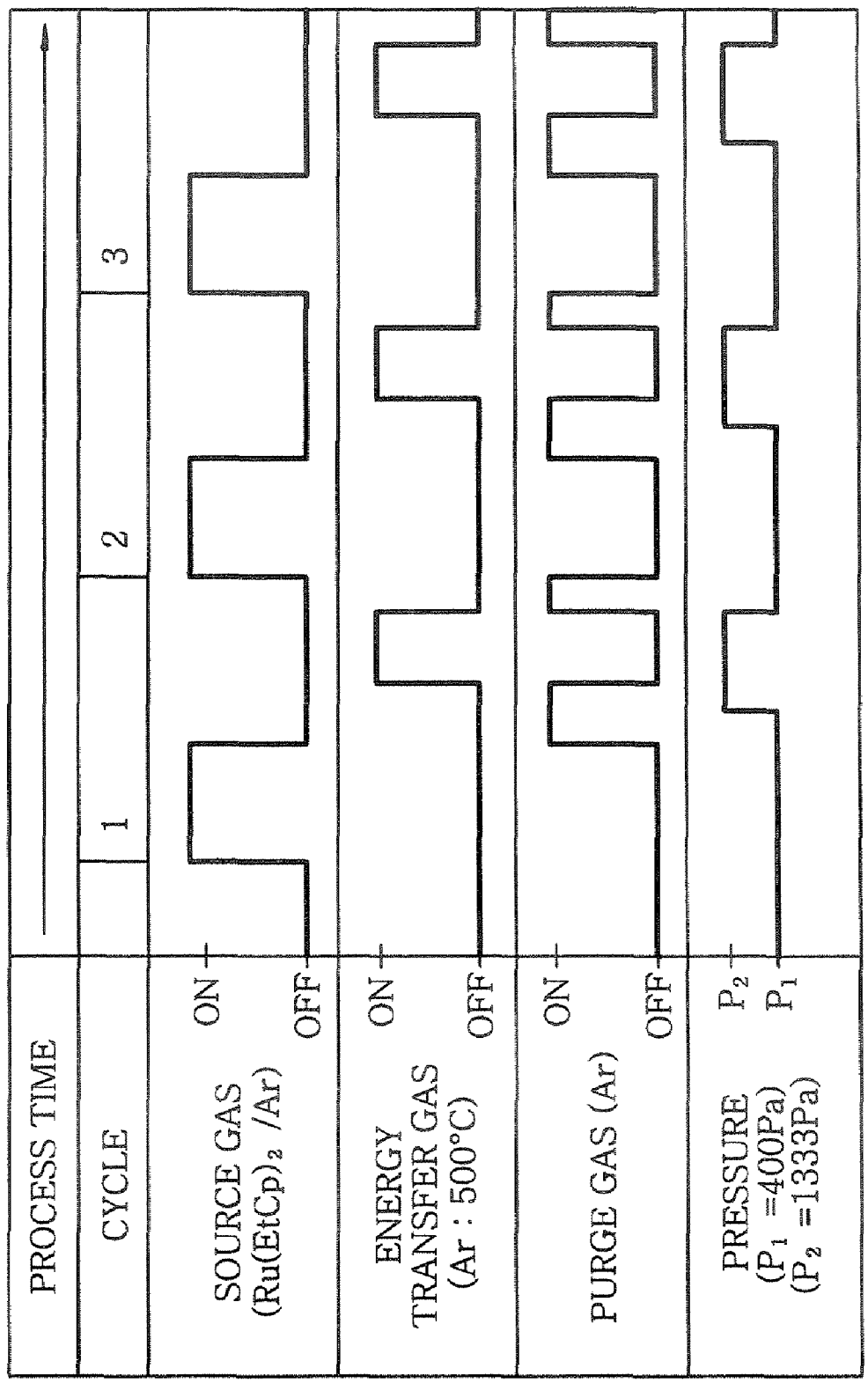
FIG. 16 provides a timing chart of a film formation of a third example.

Next, a film forming process was carried out by performing following steps 1 to 4. FIG. 16 shows a timing chart of the film forming process in this example:

Step 1;

$Ru(EtCp)_2$ of 0.2 g/min and the carrier gas of Ar of 100 mL/min (sccm) were set to flow for 20 seconds while setting an inner pressure of the chamber at 400 Pa (3 Torr).

Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing.

Step 3;

Ar heated to 500° C. was set to flow for 10 seconds while setting the inner pressure of the chamber at 1333 Pa (10 Torr). The flow rate of Ar was 1000 mL/min (sccm).

Step 4;

A purge process was performed by flowing a dilution gas of Ar of 1000 mL/min (sccm) as a purge gas for 10 seconds while setting the inner pressure of the chamber at 400 Pa (3 Torr).

By repeating the steps 1 to 4 eight times a Ru film having a film thickness of 29 nm was formed.

EXAMPLE 4

A wafer W having a diameter of 300 mm is loaded via a transfer robot (not shown) into an aluminum vacuum film forming apparatus having a mounting table whose temperature is controllable as in FIG. 1 and then mounted on the mounting table having a temperature controlled to a preset level of 100° C.

A liquid source material of $Ru(EtCp)_2$ was introduced into a vaporizer heated to 150° C. and, then, the vaporized gas was introduced into the vacuum film forming apparatus by a carrier gas of Ar. Introduced into the chamber 1 were $Ru(EtCp)_2$, Ar serving as a carrier gas and dilution gas; and Ar serving as an energy transfer gas heated to a high temperature for a film forming reaction.

Next, a film forming process was carried out by performing following steps 1 to 5:

Step 1;

$Ru(EtCp)_2$ of 0.5 g/min and the carrier gas of Ar of 100 mL/min (sccm) were set to flow for 20 seconds while setting an inner pressure of the chamber at 400 Pa (3 Torr), Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing, Step 3;

Ar heated to 500° C. was set to flow for 10 seconds while setting the inner pressure of the chamber at 1333 Pa (10 Torr). The flow rate of Ar was 1000 mL/min (sccm)

Step 4;

A purge process was carried out by flowing a dilution gas of Ar of 1000 mL/min (sccm) as a purge gas for 10 seconds while setting the inner pressure of the chamber at 400 Pa (3 Torr), Step 5;

$Ru(EtCp)_2$ of 0.5 g/min and the carrier gas of Ar of 100 mL/min (sccm) were set to flow for 20 seconds while setting the inner pressure of the chamber at 666.6 Pa (5 Torr).

By performing four times the steps 1 to 5 as a nucleation process and six times the steps 5, 2, 3 and 4 as a main deposition process, a Ru film having a film thickness of 32 nm was formed.

EXAMPLE 5

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 10° C.

A solid source material of $Ru_3(CO)_{12}$ in a vessel having a temperature controlled to 50° C. was introduced into the vacuum film forming apparatus by using a bubbling method employing Ar as a carrier gas.

Introduced into the chamber were $Ru_3(CO)_{12}$, Ar serving as a carrier and dilution gas; and Ar serving as an energy transfer gas heated to a high temperature for a film forming reaction.

Figure 17:
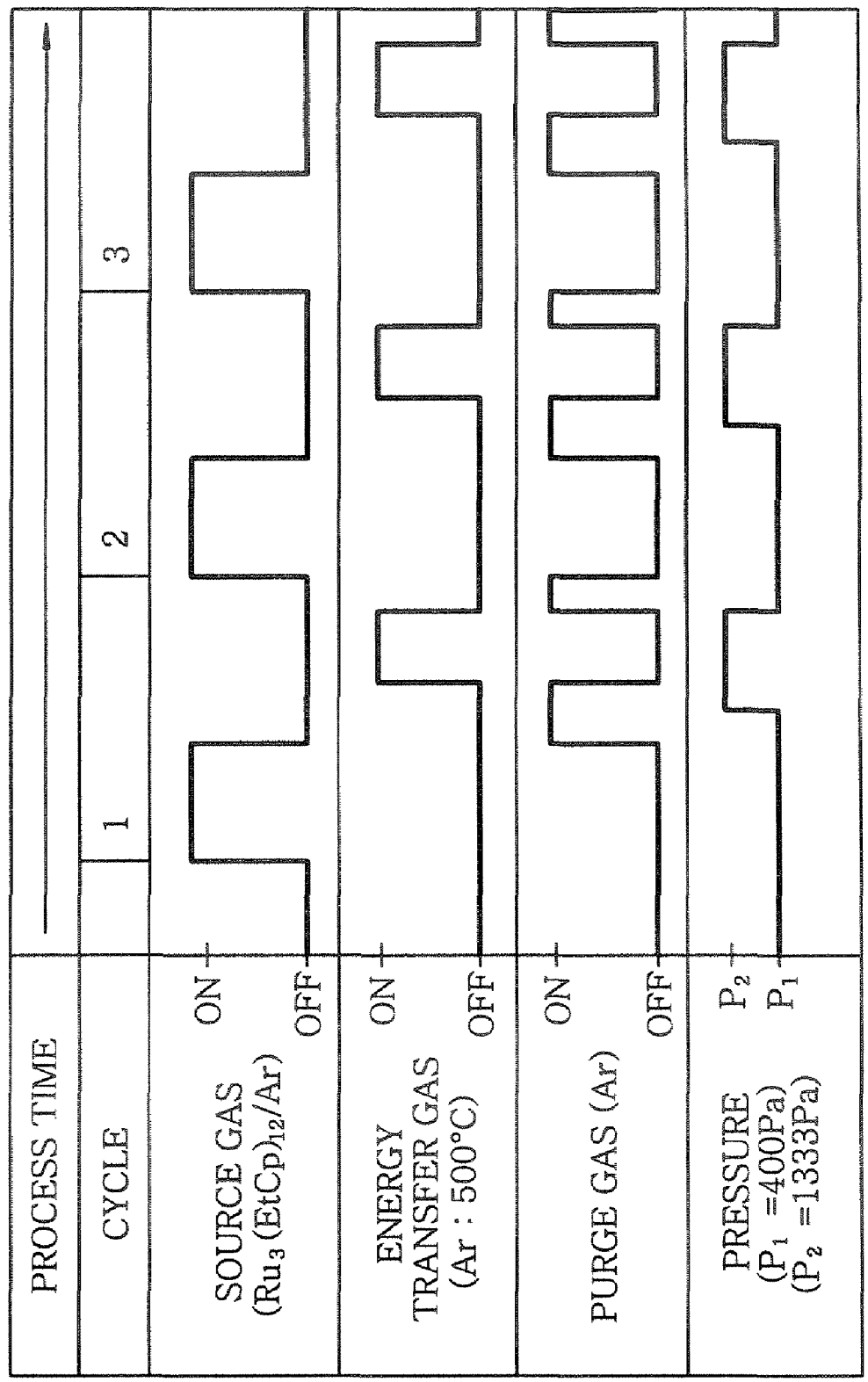
FIG. 17 shows a timing chart of a film formation of a fifth example.

Next, a film forming process was carried out by performing following steps 1 to 4. FIG. 17 shows a timing chart of the film forming process in this example:

Step 1;

$Ru_3(CO)_{12}$ of 1 mL/min (sccm) and the carrier gas of Ar of 100 mL/min (sccm) were set to flow for 20 seconds while setting an inner pressure of the chamber at 400 Pa (3 Torr).

Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing, Step 3;

Ar heated to 500° C. was set to flow for 10 seconds while setting the pressure inside the chamber at 1333 Pa (10 Torr). The flow rate of Ar was 1000 mL/min (sccm).

Step 4;

A purge process was carried out by flowing a dilution gas of Ar of 1000 mL/min (sccm) as a purge gas for 10 seconds while setting the inner pressure of the chamber at 400 Pa (3 Torr).

By repeating the steps 1 to 4 fifty times, a Ru film having a film thickness of 5 nm was formed.

EXAMPLE 6

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C.

A source material of $Ta(Nt—Am)(NMe_2)_3$ (=TAIMATA) was introduced into a vaporizer heated to 120° C. via a line heated to 50° C. and, then, the vaporized gas was introduced into the vacuum film forming apparatus by a carrier gas of Ar. Introduced into the chamber 1 were $Ta(Nt—Am)(NMe_2)_3$, Ar serving as a carrier and dilution gas; and $NH_3$ serving as a reactant gas and Ar serving as an energy transfer gas heated to a high temperature for a film forming reaction.

Figure 18:
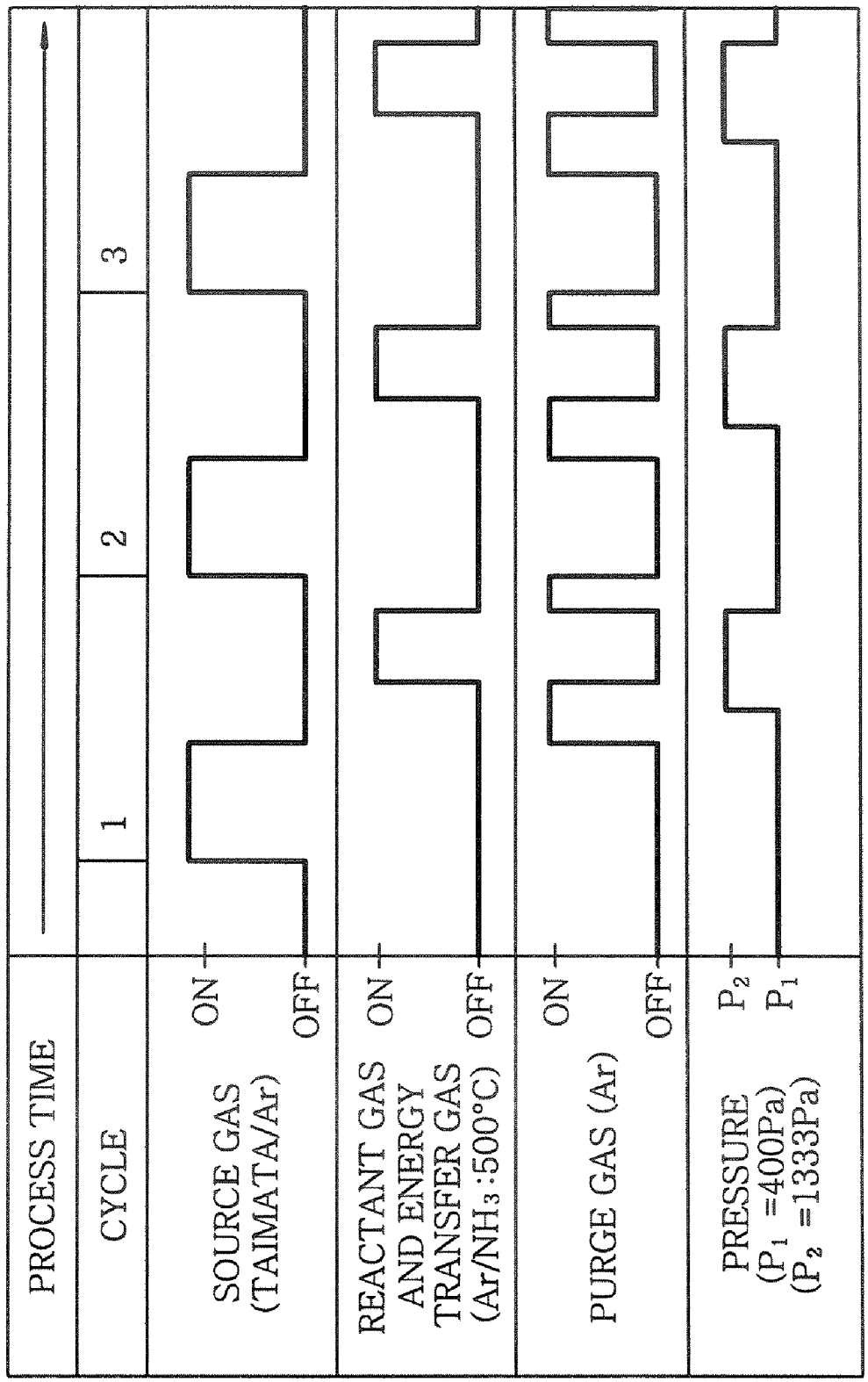
FIG. 18 offers a timing chart of a film formation of a sixth example.

Next, a film forming process was carried out by performing following steps 1 to 4. FIG. 18 shows a timing chart of the film forming process in this example:

Step 1;

$Ta(Nt—Am)(NMe_2)_3$ of 0.2 g/min (sccm) and the carrier gas of Ar of 100 mL/min (sccm) were set to flow for 20 seconds while setting an inner pressure of the chamber at 400 Pa (3 Torr)

Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing.

Step 3;

$NH_3$ and Ar, each being heated to 500° C., were set to flow for 10 seconds at while setting the inner pressure of the chamber at 1333 Pa (10 Torr). The flow rates of $NH_3$ and Ar were 700 and 300 mL/min (sccm).

Step 4;

A purge process was carried out by flowing a dilution gas of Ar of 1000 mL/min (sccm) as a purge gas for 10 seconds while setting the inner pressure of the chamber at 400 Pa (3 Torr).

By repeating the steps 1 to 4 eight times, a TaN film having a film thickness of 54 nm was formed.

EXAMPLE 7

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C. A source of $Ta(Nt—Am)(NMe_2)_3$ was introduced into a vaporizer heated to 120° C. via a line heated to 50° C. and, then, the vaporized gas was introduced into the vacuum film forming apparatus by a carrier gas of Ar. Introduced into the chamber 1 were $Ta(Nt—Am)(NMe_2)_3$, Ar serving as a carrier and dilution gas; and Ar serving as an energy transfer gas heated to a high temperature for a film forming reaction.

Figure 19:
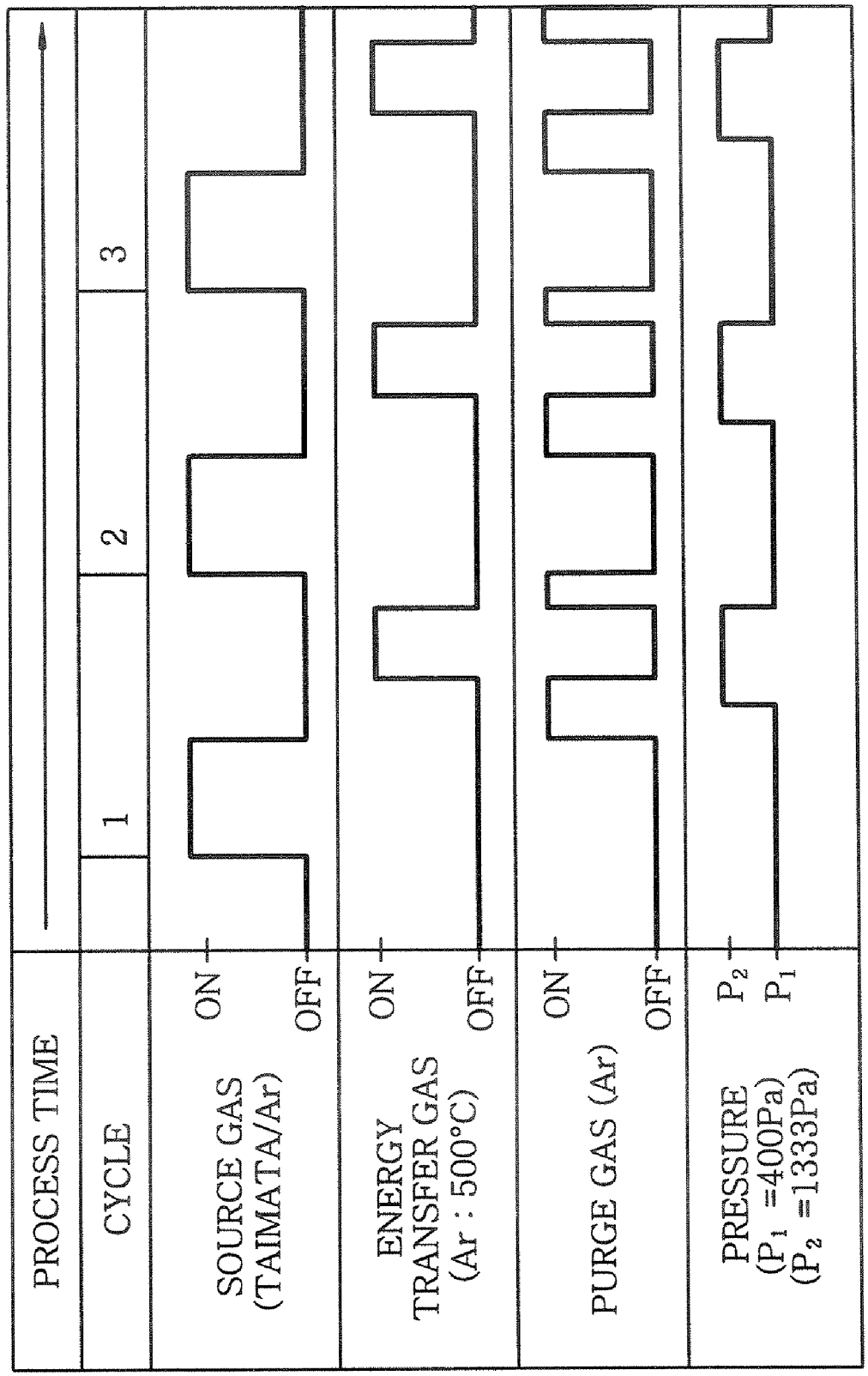
FIG. 19 depicts a timing chart of a film formation of a seventh example.

Next, a film forming process was carried out by performing following steps 1 to 4. FIG. 19 shows a timing chart of the film forming process in this example:

Step 1;

$Ta(Nt—Am)(NMe_2)_3$ of 0.2 g/min (sccm) and the carrier gas of Ar of 100 mL/min (sccm) were set to flow for 20 seconds while setting an inner pressure of the chamber at 400 Pa (3 Torr).

Step 2;

A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing.

Step 3;
Ar heated to 500° C. was set to flow for 10 seconds while setting the inner pressure of the chamber at 1333 Pa (10 Torr). The flow rate of Ar was 1000 mL/min (sccm).
Step 4;
A purge process was carried out by flowing a dilution gas of Ar of 1000 mL/min (sccm) as a purge gas for 10 seconds while setting the inner pressure of the chamber at 400 Pa (3 Torr).
By repeating the steps 1 to 4 ten times, a TaN film having a film thickness of 25 nm was formed.

EXAMPLE 8

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 100° C.

A source material of Ta(Nt—Am)(NMe$_2$)$_3$ was introduced into a vaporizer heated to 120° C. via a line heated to 50° C. and, then, the vaporized gas was introduced into the vacuum film forming apparatus by a carrier gas of Ar. Introduced into the chamber 1 were Ta(Nt—Am)(NMe$_2$)$_3$, Ar serving as a carrier and dilution gas; and Ar serving as an energy transfer gas heated to a high temperature for a film forming reaction.

Next, a film forming process was carried out by performing following steps 1 to 4:
Step 1;
Ta(Nt—Am)(NMe$_2$)$_3$ of 0.2 g/min (sccm) and the carrier gas of Ar of 100 mL/min (sccm) set to flow for 20 seconds while setting an inner pressure of the chamber at 400 Pa (3 Torr).
Step 2;
A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing.
Step 3;
Ar heated to 500° C. was set to flow for 10 seconds while setting the inner pressure of the chamber at 1333 Pa (10 Torr). The flow rate of Ar was 1000 mL/min (sccm).
Step 4;
A purge process was carried out by flowing a dilution gas of Ar of 1000 mL/min (sccm) as a purge gas for 10 seconds while setting the inner pressure of the chamber at 400 Pa (3 Torr).
By repeating the steps 1 to 4 ten times, a TaN film having a film thickness of 25 nm was formed.

EXAMPLE 9

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 10° C.

A solid source material of W(CO)$_6$ in a vessel having a temperature controlled to 50° C. was introduced into the vacuum film forming apparatus by using a bubbling method employing Ar as a carrier gas. Introduced into the chamber were W(CO)$_6$, Ar serving as a carrier and dilution gas; and Ar serving as an energy transfer gas heated to a high temperature for a film forming reaction.

Figure 20:
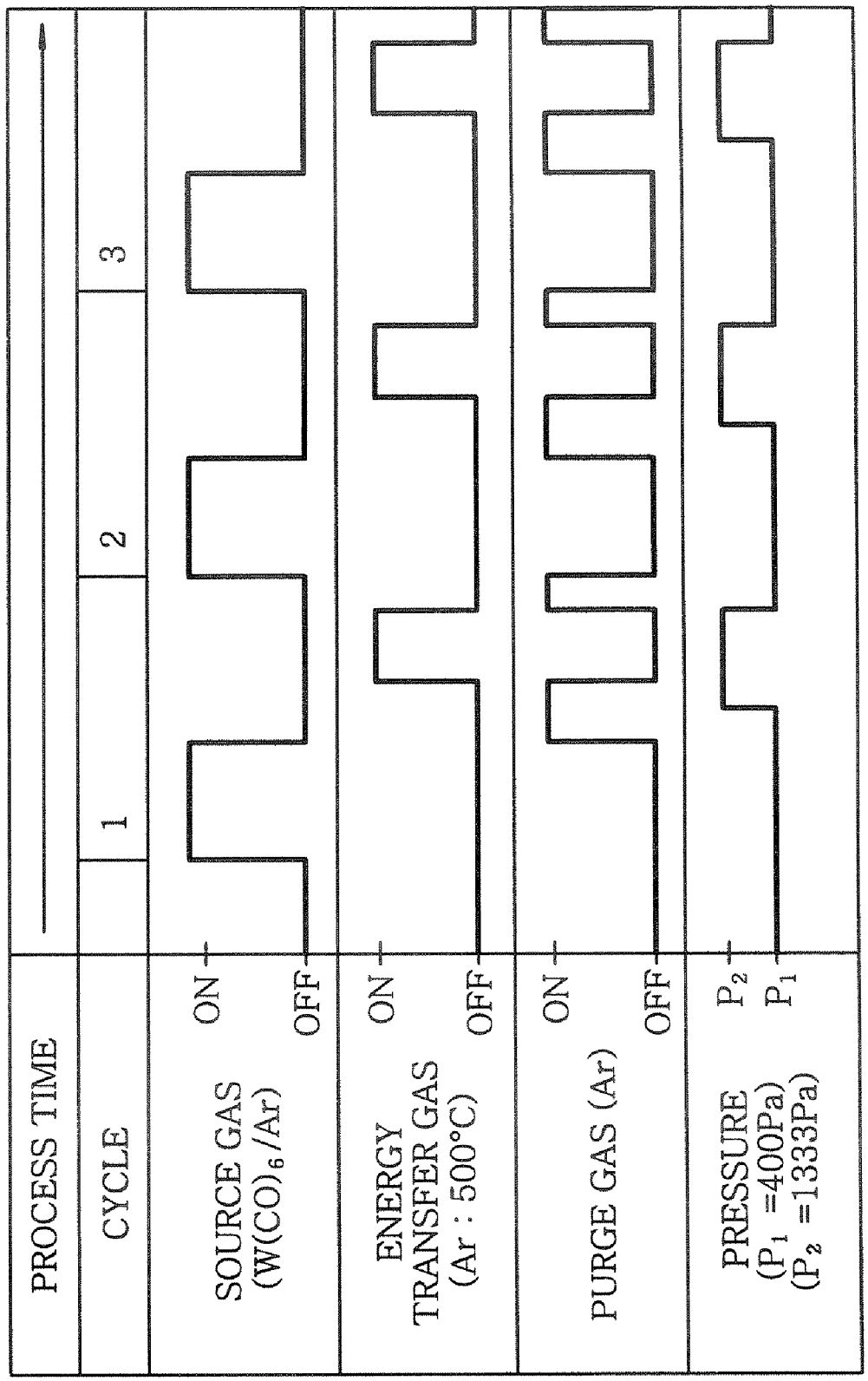
FIG. 20 presents a timing chart of a film formation of a ninth example.

Next, a film forming process was carried out by performing following steps 1 to 4. FIG. 20 provides a timing chart of the film forming process in this example:
Step 1;
W(CO)$_6$ of 5 mL/min (sccm) and the carrier gas of Ar of 100 mL/min (sccm) were set to flow for 20 seconds while setting an inner pressure of the chamber at 400 Pa (3 Torr).
Step 2;
A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing.
Step 3;
Ar heated to 500° C. was set to flow for 10 seconds while setting the inner pressure of the chamber at 1333 Pa (10 Torr). The flow rate of Ar was 1000 mL/min (sccm).
Step 4;
A purge process was carried out by flowing a dilution gas of Ar of 1000 mL/min (sccm) as a purge gas for 10 seconds while setting the inner pressure of the chamber at 400 Pa (3 Torr).
By repeating the steps 1 to 4 twenty times, a W film having a film thickness of 10 nm was formed.

EXAMPLE 10

A wafer W having a diameter of 300 mm was loaded via a transfer robot (not shown) into an aluminum vacuum film forming apparatus having a mounting table whose temperature is controllable as in FIG. 1 and then mounted on the mounting table having a temperature controlled to a preset level of 10° C.

A solid source material of W(CO)$_6$ in a vessel having a temperature controlled to 50° C. was introduced into the vacuum film forming apparatus by using a bubbling method employing Ar as a carrier gas. Introduced into the chamber were W(CO)$_6$, Ar serving as a carrier and dilution gas; and H$_2$ serving as a reactant gas heated to a high temperature for a film forming reaction and Ar as an energy transfer gas.

Figure 21:
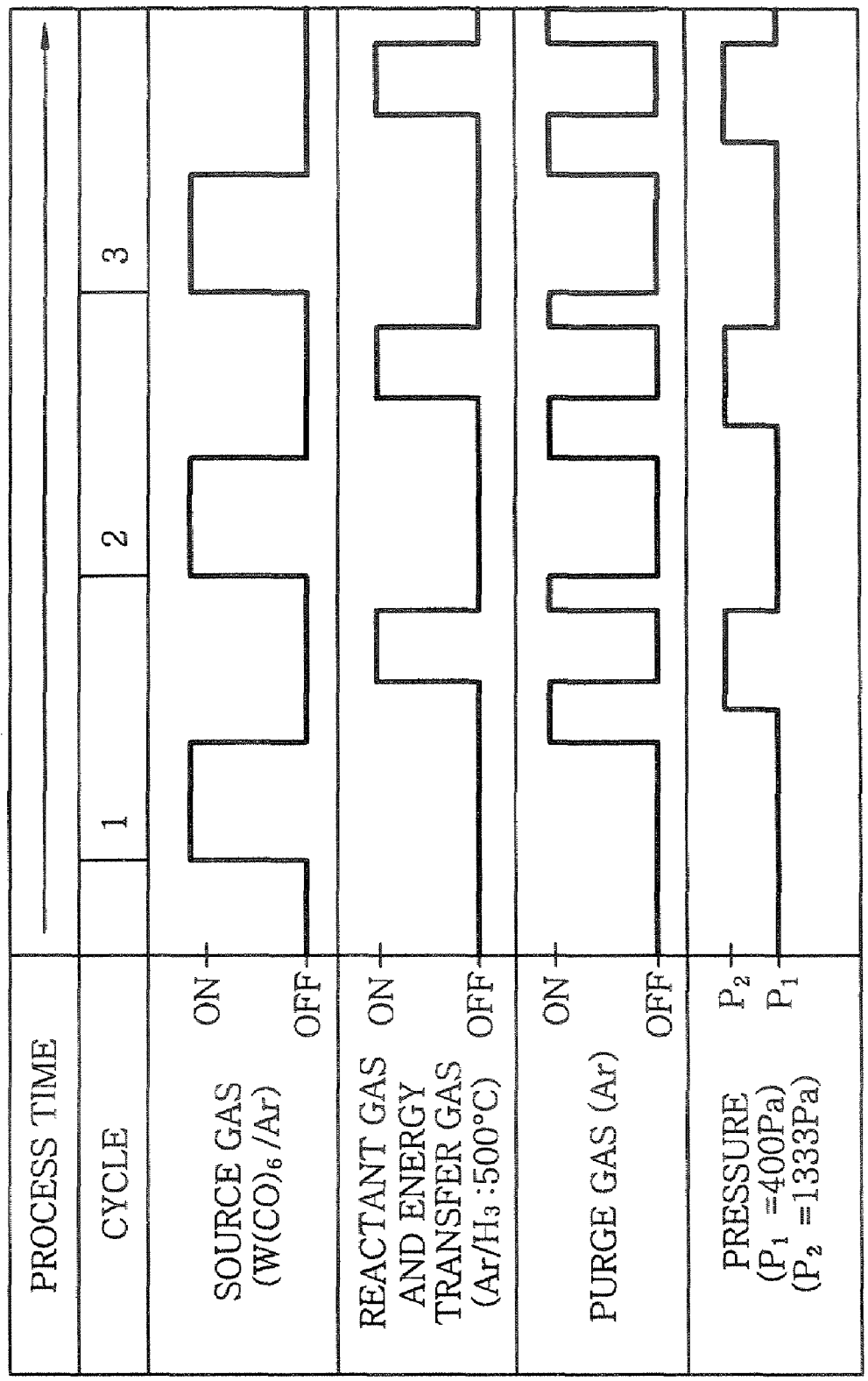
FIG. 21 represents a timing chart of a film formation of a tenth example.

Next, a film forming process was carried out by performing following steps 1 to 4. FIG. 21 provides a timing chart of the film forming process in this example:
Step 1;
W(CO)$_6$ of 5 mL/min (sccm) and the carrier gas of Ar of 100 mL/min (sccm) were set to flow for 20 seconds while setting an inner pressure of the chamber at 400 Pa (3 Torr),
Step 2;
A purge process was performed by flowing a dilution gas of Ar of 500 mL/min (sccm) as a purge gas for 10 seconds while setting an inner pressure of the chamber at 400 Pa (3 Torr) and, then, the inner pressure of the chamber was increased to 1333 Pa (10 Torr) while the purge gas was flowing,
Step 3;
H$_2$ and Ar, each being heated to 500° C., were set to flow for 10 seconds while setting the inner pressure of the chamber at 1333 Pa (10 Torr). The flow rates of H$_2$ and Ar were 800 and 200 mL/min (sccm), respectively.
Step 4;
A purge process was carried out by flowing a dilution gas of Ar of 1000 mL/min (sccm) as a purge gas for 10 seconds while setting the inner pressure of the chamber at 400 Pa (3 Torr).
By repeating the steps 1 to 4 twenty times, a W film having a film thickness of 10 nm was formed.

The present invention may be variously modified without being limited to the aforementioned embodiments.

Figure 22:
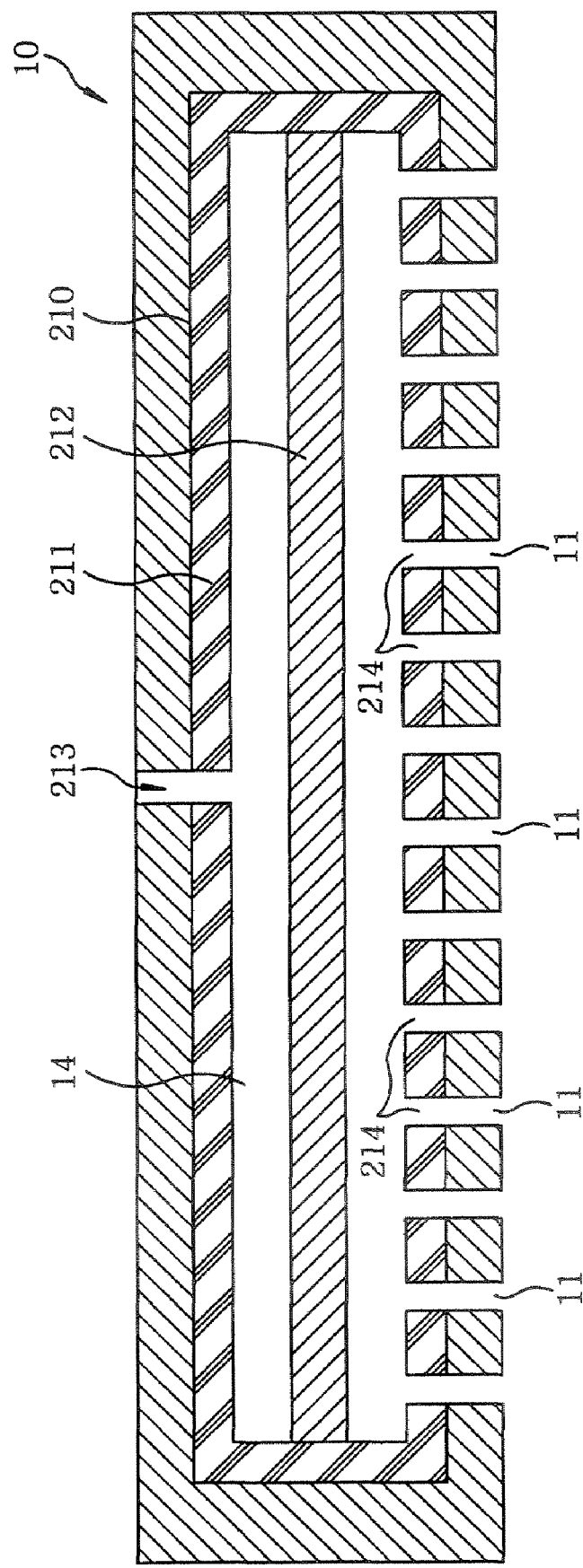
FIG. 22 illustrates a schematic configuration of a shower head having a cylindrical heater.
Figure 23:
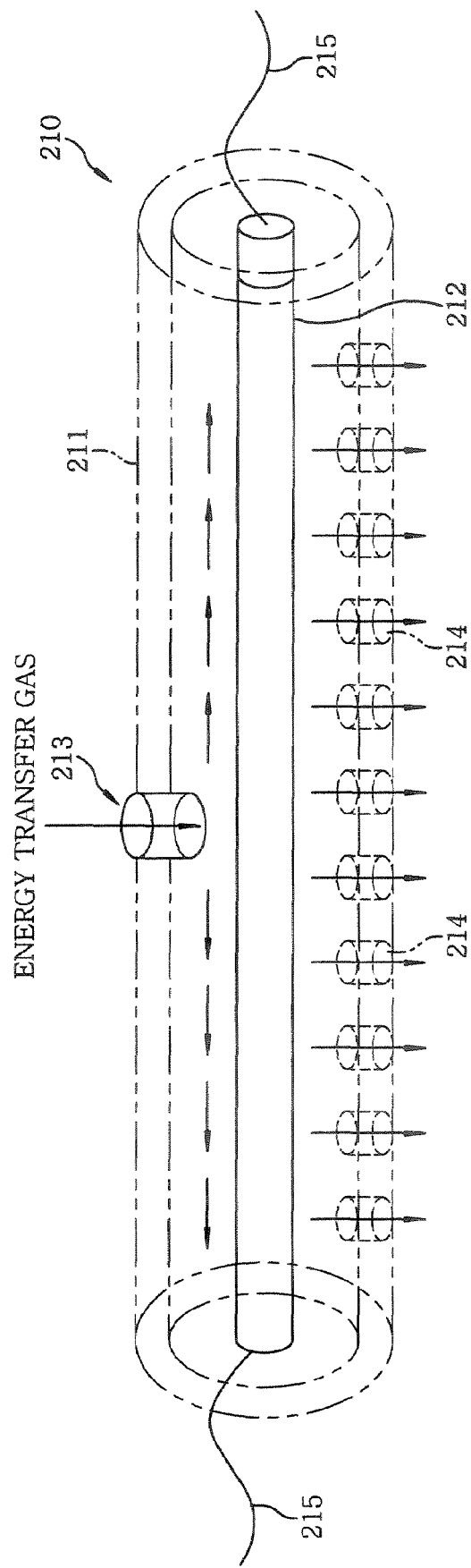
FIG. 23 shows a schematic configuration of the cylindrical heater.
Figure 24:
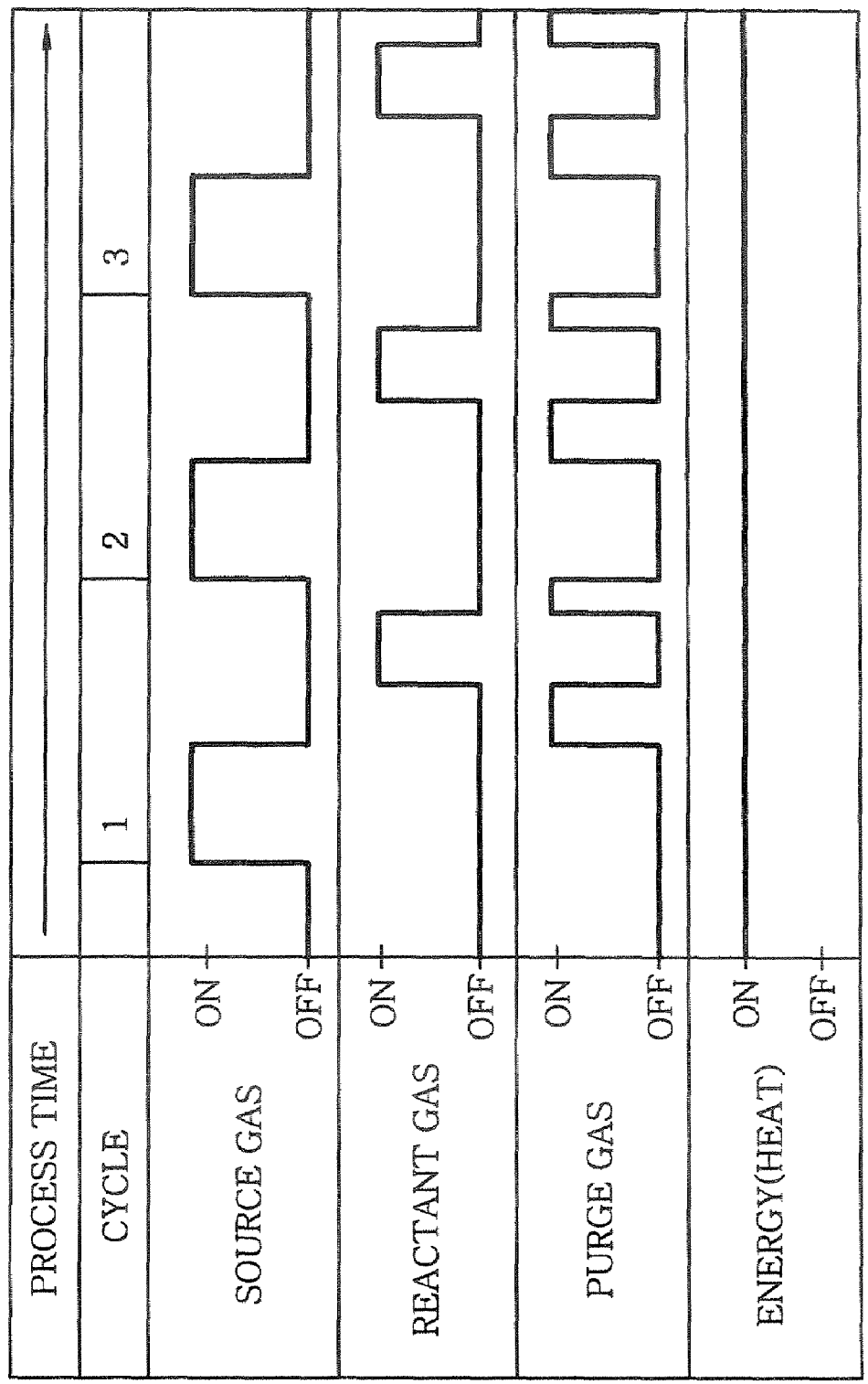
FIG. 24 offers a timing chart of a conventional thermal ALD.

For example, although the heaters 15 for heating the energy transfer gas are provided around the gas injection openings 11 of the shower head 10 in the film forming apparatus 100 of FIG. 1, the heaters may be installed in the diffusion space 14 of the shower head 10. In such a case, there can be used a cylindrical heater 210 having a bar-shaped resistance 212 installed in an elongated cylindrical container 211 made of an insulating material such as heat resistant synthetic resin, quartz, ceramic or the like, as shown in FIGS. 22 and 23. The bar-shaped resistance 212 is connected with a heater power supply (not shown) via lead lines 215, so that an inside of the container 211 can be rapidly heated by supplying power to the heater 210. Further, a gas inlet 213 is provided at one place of an upper portion of the container 211. A plurality of gas outlets 214 communicating with the gas injection openings 11 of the shower head 10 are formed at a lower portion of the container 211. The energy transfer gas can be rapidly heated while passing through the inside of the container 211. Moreover, a number of the cylindrical heaters 210 may be disposed side by side inside the diffusion space 14 of the shower head 10.

Although the first to the third embodiments employ the fixed mounting table 3, there may be used a mounting table 3 horizontally rotatable by a rotating unit. In such a case, a more uniform thickness and quality of a thin film formed on the surface of the wafer W can be achieved during the adsorption process for adsorbing a film forming material on the surface of the wafer W and the reaction process for carrying out a film forming reaction on the surface of the wafer W.

The present invention can be appropriately used for forming a desired film on a substrate such as a semiconductor wafer or the like during a manufacturing process of various semiconductor devices, for example.

What is claimed is:

1. A film forming method for depositing a film on a surface of a substrate mounted on a mounting table disposed in a vacuum processing chamber, the method comprising:
   an adsorption process for adsorbing a film forming material on the substrate by introducing a source gas into the processing chamber; and
   a reaction process for carrying out, after the adsorption process, a film forming reaction by supplying thermal energy to the film forming material adsorbed on the substrate by an energy transfer gas introduced into the processing chamber,
   wherein the adsorption process is performed while controlling a temperature of the substrate mounted on the mounting table to a level which allows the film forming material to be adsorbed on the substrate, and the level of the temperature is between −20° C. and 100° C.

2. The method of claim 1, further comprising a purge process for introducing a purge gas into the processing chamber.

3. The method of claim 1, further comprising a pressure increasing process for increasing, before the reaction process, an inner pressure of the processing chamber.

4. The method of claim 1, wherein in the reaction process, a reactant gas chemically participating in the film forming reaction is introduced in addition to the energy transfer gas.

5. The method of claim 1, wherein the energy transfer gas is one of a reduction gas, a carbonization gas, a nitrification gas and an oxidizing gas.

6. The method of claim 1, wherein the source gas is introduced and exhausted such that a gas flow of the source gas is formed in a direction parallel to the surface of the substrate mounted on the mounting table.

7. The method of claim 1, wherein the source gas is introduced and exhausted such that a gas flow of the source gas is formed in a direction of colliding against the surface of the substrate mounted on the mounting table.

8. The method of claim 1, wherein the energy transfer gas is injected toward the surface of the substrate mounted on the mounting table, the surface having the film forming material adsorbed thereon.

9. The method of claim 1, wherein the film forming material contains at least one metal element selected from the group consisting of Al, Si, Ti, Cr, Mn, Fe, Co, Ni, Cu, Zn, Ge, Zr, Mo, Ru, Rh, Pd, Ag, Ba, Hf, Ta, W, Re, Jr and Pt.

10. The method of claim 1, wherein the film is deposited on the substrate through an atomic layer deposition method by repeating a plurality of cycles, wherein in each cycle, the film forming reaction takes place on a monomolecular or a multimolecular adsorption layer of the film forming material on the substrate.

11. A computer-executable program for controlling, when executable, the processing chamber such that the film forming method described in claim 1 is performed.

12. A computer readable storage medium for storing therein a computer-executable program, wherein the control program controls the processing chamber such that the film forming method described in claim 1 is performed.

13. The method of claim 1, wherein the energy transfer gas is heated and then introduced into the processing chamber.

14. The method of claim 2, wherein the adsorption process and the reaction process are alternately performed, and the purge process is performed therebetween.

15. The method of claim 3, further comprising a pressure decreasing process for decreasing the inner pressure of the processing chamber upon or after the reaction process is completed.

16. The method of claim 4, wherein the reactant gas is one of a reduction gas, a carbonization gas, a nitrification gas and an oxidizing gas.

17. A film forming apparatus comprising:
   a processing chamber, accommodating therein a substrate, for performing a film forming process;
   a mounting table for mounting thereon the substrate in the processing chamber;
   a source gas inlet for introducing a source gas into the processing chamber;
   an energy transfer gas inlet for injecting an energy transfer gas toward a surface of the substrate mounted on the mounting table in the processing chamber;
   a gas exhaust unit for vacuum exhausting an inside of the processing chamber; and
   a controller for controlling the film forming method described in claim 1 to be performed.

18. A film forming apparatus comprising:
   a processing chamber, accommodating therein a substrate, for performing a film forming process;
   a mounting table for mounting thereon the substrate in the processing chamber;
   a source gas inlet for introducing a source gas into the processing chamber;
   an energy transfer gas inlet for injecting an energy transfer gas toward a surface of the substrate mounted on the mounting table in the processing chamber; and
   a gas discharge port connected with a gas exhaust unit for vacuum exhausting an inside of the processing chamber,
   wherein the source gas inlet and the gas discharge port are disposed such that the introduced source gas flows in a direction parallel to a surface of the substrate mounted on the mounting table before being exhausted, and wherein the mounting table includes a temperature control unit for controlling a temperature of the substrate mounted thereon to a level which allows the source gas to be adsorbed on the substrate and the level of the temperature is between −20° C. and 100° C.

19. A film forming apparatus comprising:

a processing chamber, accommodating therein a substrate, for performing a film forming process;

a mounting table for mounting thereon the substrate in the processing chamber;

a source gas inlet for introducing a source gas into the processing chamber;

an energy transfer gas inlet for injecting an energy transfer gas toward a surface of the substrate mounted on the mounting table in the processing chamber; and a gas discharge port connected with a gas exhaust unit for vacuum exhausting an inside of the processing chamber, wherein the source gas inlet and the gas discharge port are disposed such that the introduced source gas flows in a direction of colliding against the surface of the substrate mounted on the mounting table before being exhausted, and wherein the mounting table includes a temperature control unit for controlling a temperature of the substrate mounted thereon to a level which allows the source gas to be adsorbed on the substrate, the level of the temperature is between −20° C. and 100° C.

* * * * *